(12) United States Patent
Chaivipas et al.

(10) Patent No.: US 8,854,102 B2
(45) Date of Patent: Oct. 7, 2014

(54) CLOCK GENERATING CIRCUIT

(71) Applicant: Fujitsu Limited, Kawasaki (JP)

(72) Inventors: Win Chaivipas, Kawasaki (JP); Atsushi Matsuda, Akishima (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/070,005

(22) Filed: Nov. 1, 2013

(65) Prior Publication Data

US 2014/0055181 A1  Feb. 27, 2014

Related U.S. Application Data

(63) Continuation of application No. PCT/JP2011/060584, filed on May 6, 2011.

(51) Int. Cl.
| | |
|---|---|
| *H03K 3/00* | (2006.01) |
| *H03L 7/081* | (2006.01) |
| *H03L 7/23* | (2006.01) |
| *H03L 7/16* | (2006.01) |
| *H03K 5/26* | (2006.01) |

(52) U.S. Cl.
CPC .............. *H03L 7/081* (2013.01); *H03L 7/235* (2013.01); *H03L 7/16* (2013.01); *H03L 7/0812* (2013.01); *H03K 5/26* (2013.01)
USPC ........................................................ 327/291

(58) Field of Classification Search
USPC ........................................................ 327/291
See application file for complete search history.

(56) References Cited

U.S. PATENT DOCUMENTS

| | | |
|---|---|---|
| 6,429,693 B1 | 8/2002 | Staszewski et al. |
| 2009/0303091 A1 | 12/2009 | Rivior |
| 2009/0322574 A1 | 12/2009 | Rivoir |

(Continued)

FOREIGN PATENT DOCUMENTS

| | | |
|---|---|---|
| JP | 2002-76886 | 3/2002 |
| JP | 2009-527157 | 7/2009 |
| JP | 2009-527158 | 7/2009 |
| JP | 2010-98704 | 4/2010 |
| JP | 2010-199810 | 9/2010 |

OTHER PUBLICATIONS

Notification of Transmittal of Translation of The International Preliminary Report on Patentability (Form PCT/IB/338, Form PCT/IB/373, Form PCT/ISA/237 & PCT/IB/308), PCT/JP2011/060584, 6 pages, dated Nov. 28, 2013.

(Continued)

*Primary Examiner* — Daniel Rojas

(74) *Attorney, Agent, or Firm* — Fujitsu Patent Center

(57) ABSTRACT

A clock generating circuit includes: a counter that counts a number of pulses of an oscillation clock signal existed within one cycle of a reference clock signal; a first time-to-digital converter that generates a plurality of phases of first clock signals by delaying the oscillation clock signal; a second time-to-digital converter that generates a plurality of phases of second clock signals by delaying the oscillation clock signal by a short delay time; a third time-to-digital converter that generates a plurality of phases of third clock signals by delaying the delayed first clock signal; a delay control unit that outputs a delay control signal based on a difference between a cycle of the oscillation clock signal and a target cycle; and an oscillator that generates, based on a cycle of the reference clock signal, the oscillation clock signal whose cycle is 1/m of the cycle of the reference clock signal.

9 Claims, 23 Drawing Sheets

(56) References Cited

U.S. PATENT DOCUMENTS

2010/0097150 A1    4/2010    Ueda et al.
2010/0214028 A1    8/2010    Kobayashi
2011/0074618 A1*   3/2011    Henzler ........................ 341/166

OTHER PUBLICATIONS

International Search Report, mailed in connection with PCT/JP2011/060584 and mailed Jun. 14, 2011.

* cited by examiner

F I G. 1
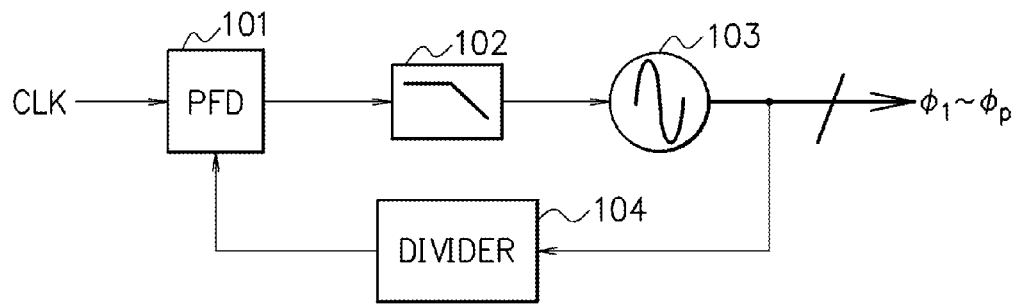
F I G. 2
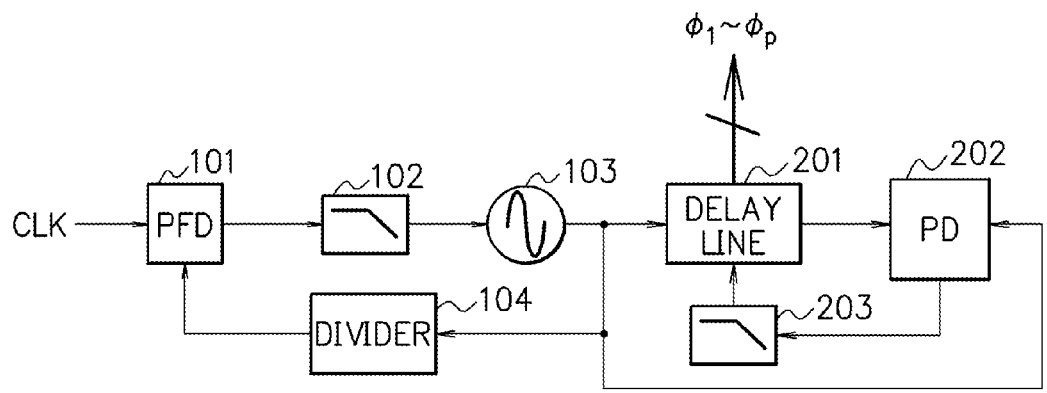
F I G. 3A
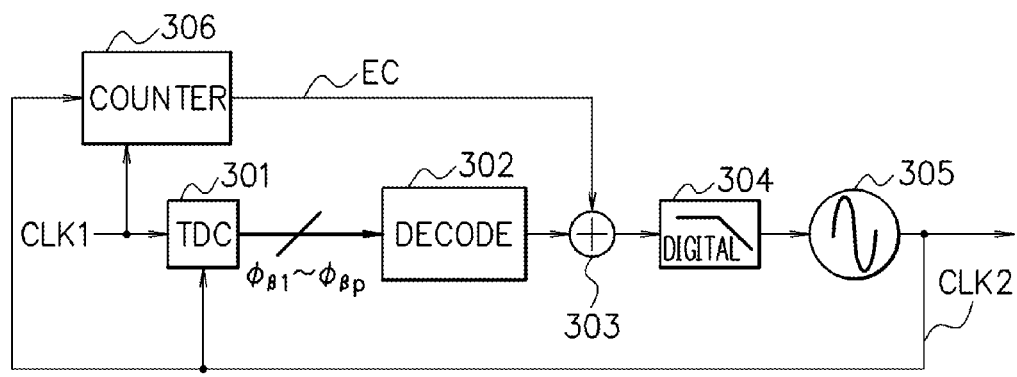

F I G. 3B
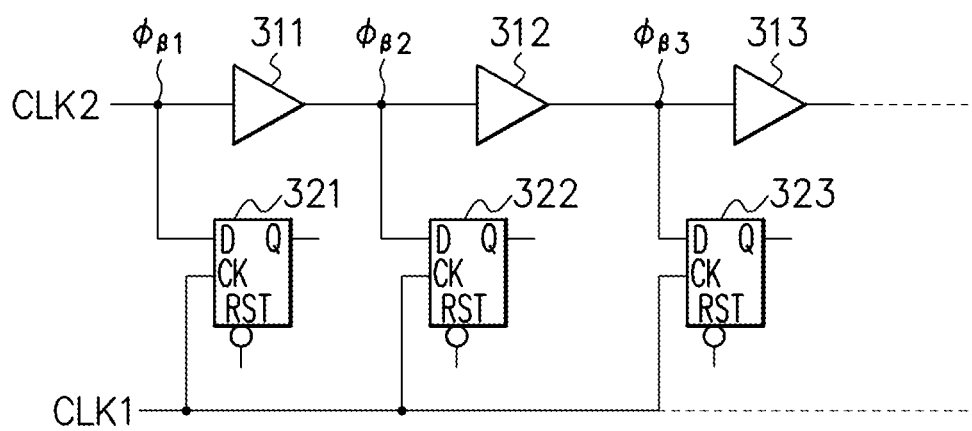

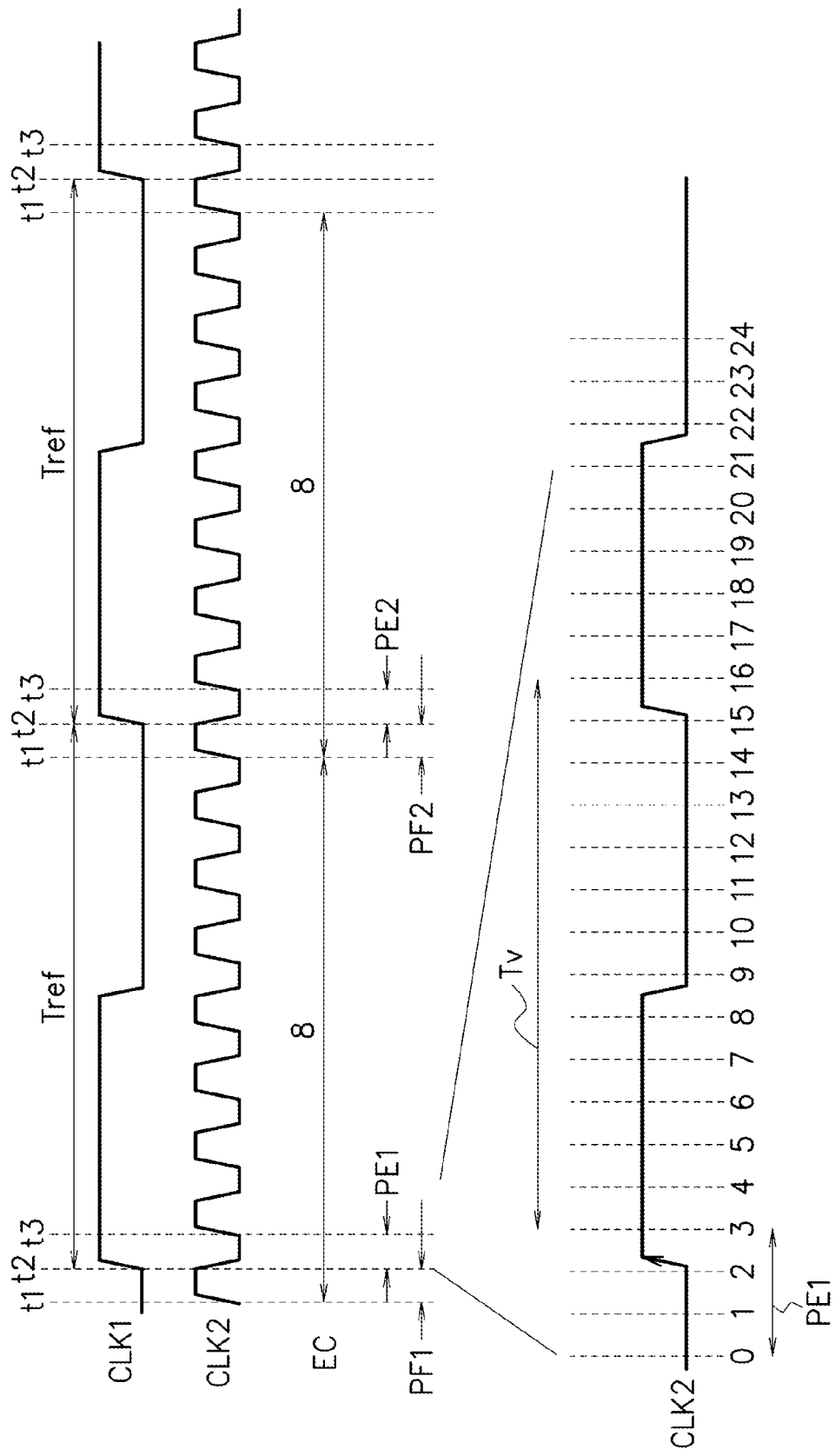

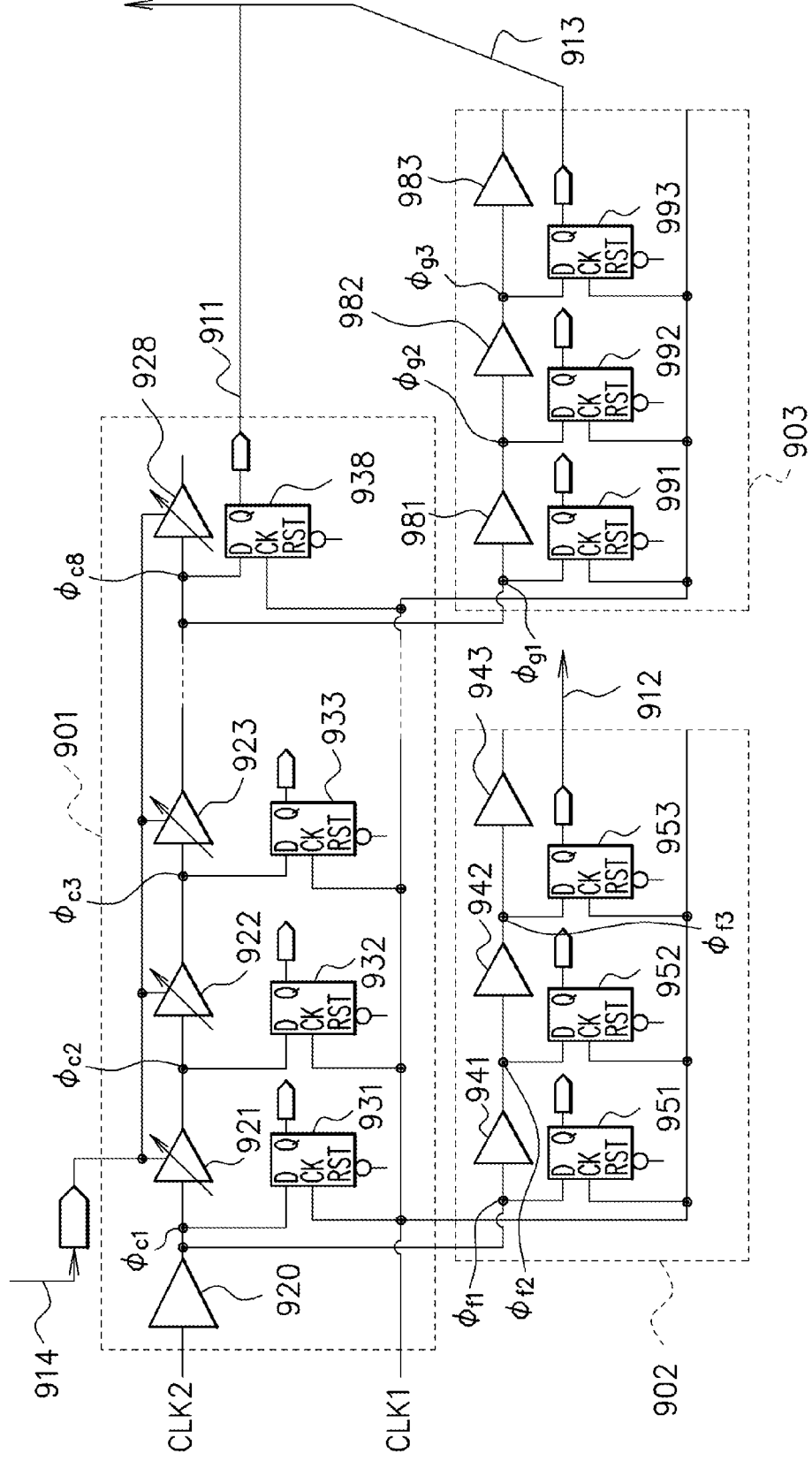

F I G. 13
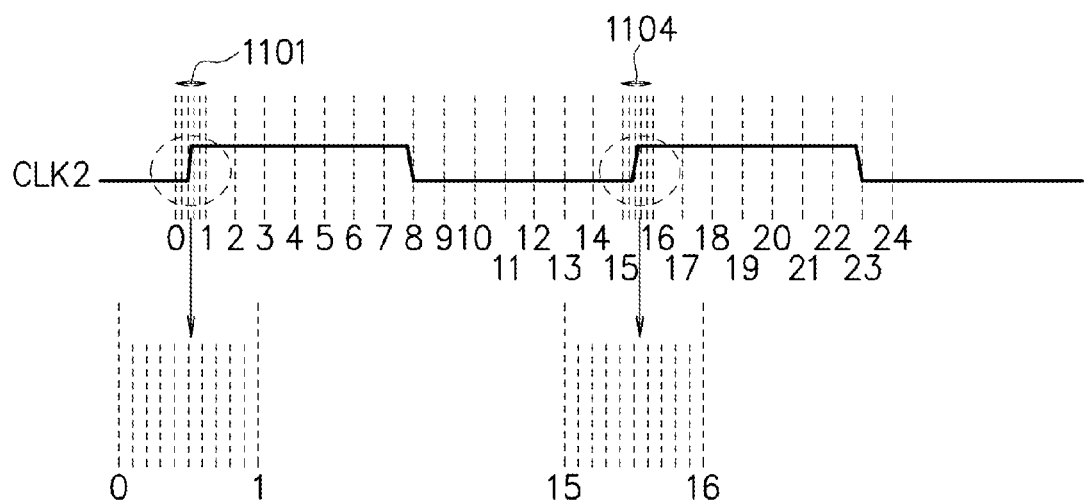
F I G. 14A
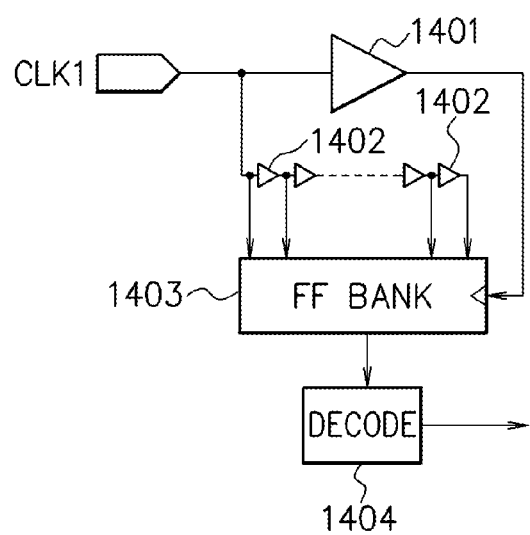

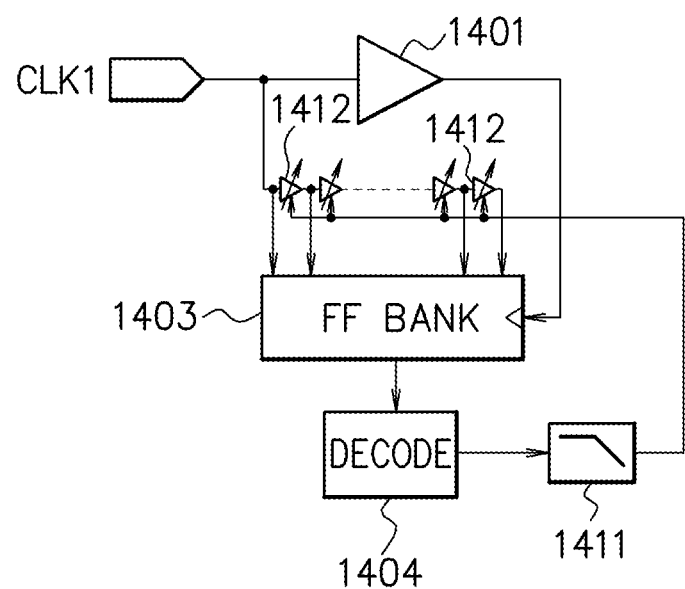
F I G. 14B

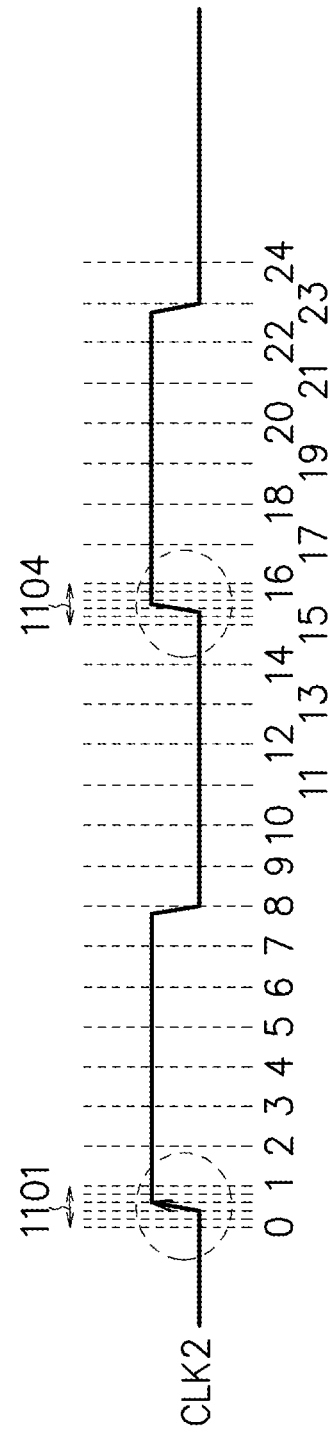

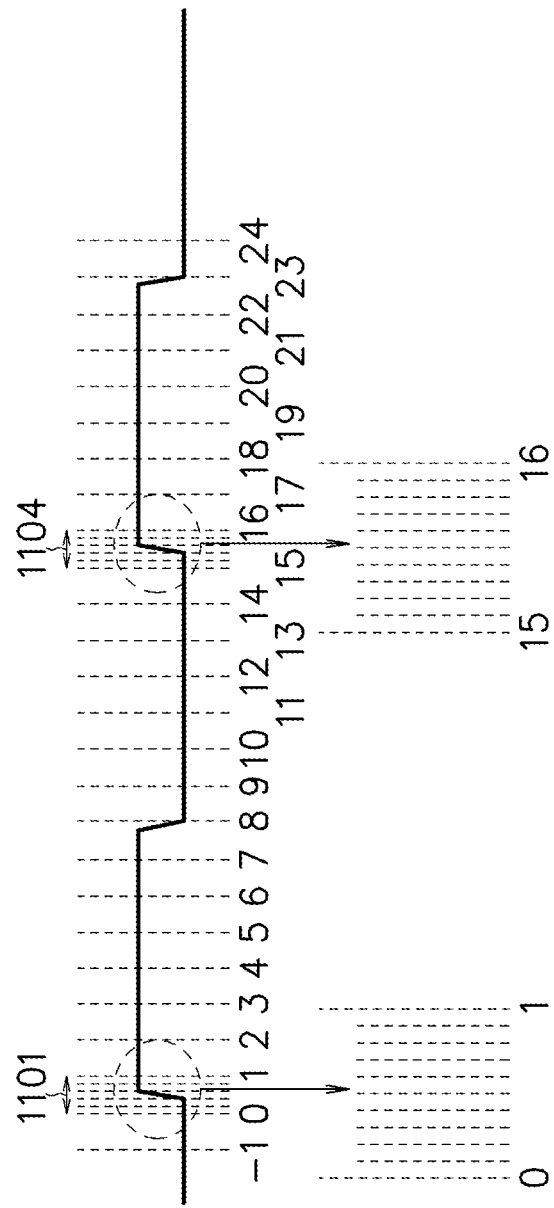

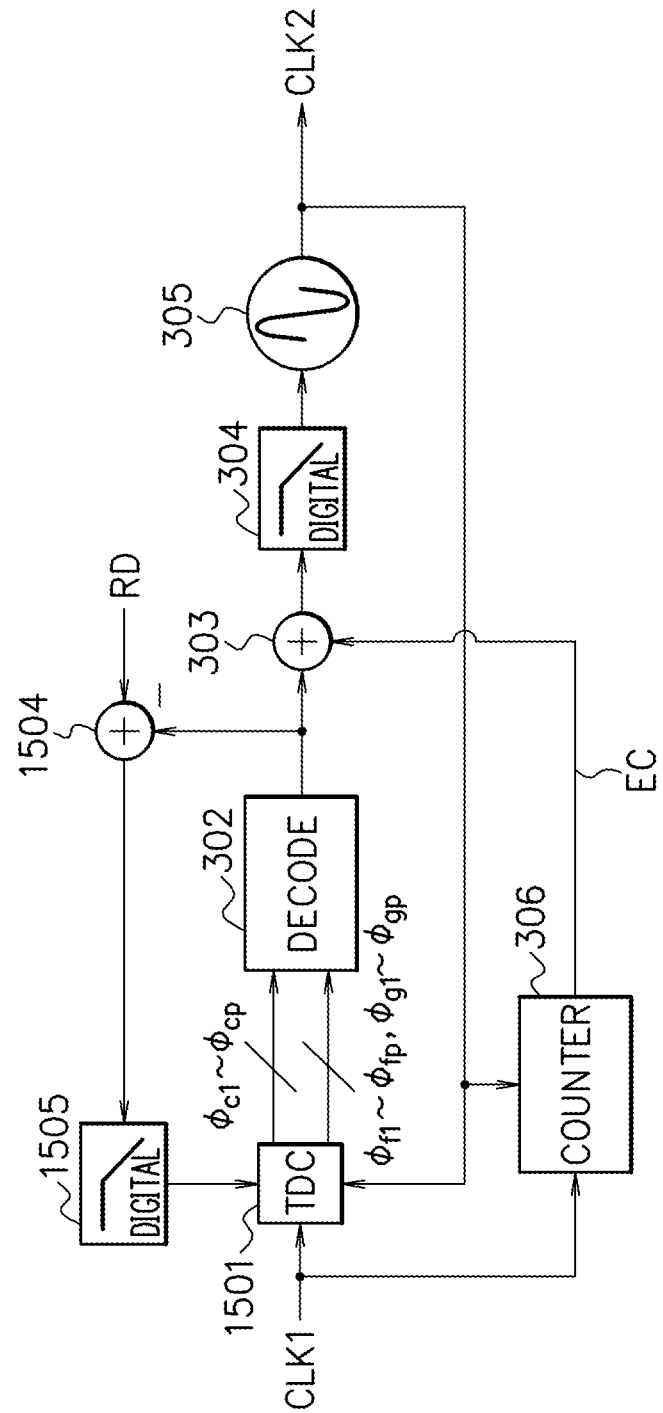
F I G. 18

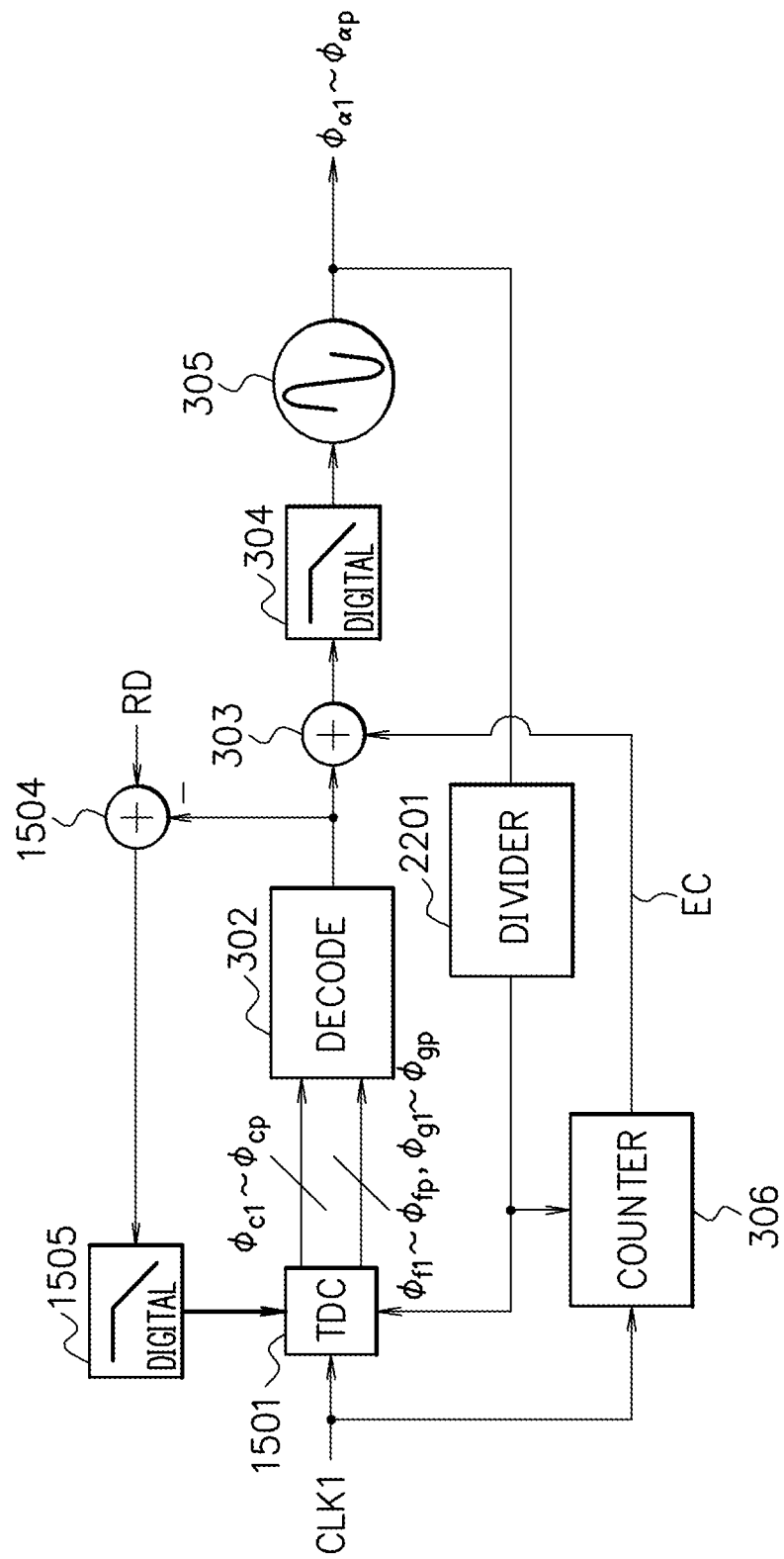

CLOCK GENERATING CIRCUIT

CROSS-REFERENCE TO RELATED APPLICATION

This application is a continuation application of International Application No. PCT/JP2011/060584 filed on May 6, 2011 and designated the U.S., the entire contents of which are incorporated herein by reference.

FIELD

The embodiments relate to a clock generating circuit.

BACKGROUND

FIG. 1 is a diagram illustrating a configuration example of a polyphase clock generating circuit. The polyphase clock generating circuit has a phase-locked loop (PLL) circuit including a phase-frequency detector 101, a low-pass filter 102, an oscillator 103 and a divider 104. The phase-frequency detector 101 compares a phase and a frequency of an output clock signal from the divider 104 and those of a reference clock signal CLK, and outputs a difference of the phases. The low-pass filter 102 averages the differences of the phases output by the phase-frequency detector 101 to output the resultant. The oscillator 103 generates and outputs a plurality of phases of clock signals φ1 to φp whose phases are adjusted so that an average value of the differences becomes small. The divider 104 divides a frequency of the clock signal φ1, for example, and outputs a clock signal whose frequency is lower than that of the clock signal φ1 to the phase-frequency detector 101 in a feedback manner. Through the feedback loop processing, the phase of the clock signal φ1 is soon converged to the same phase as that of the reference clock signal CLK, and the clock signal φ1 is locked.

The polyphase clock generating circuit in FIG. 1 has advantages that a system thereof is simple, and power consumption thereof is small. However, in the polyphase clock generating circuit in FIG. 1, the oscillator 103 is a ring oscillator, so that there are disadvantages that the noise characteristic is high, and it is not possible to achieve oscillation at a high frequency. Further, in the polyphase clock generating circuit in FIG. 1, it is possible to configure the oscillator 103 by using a plurality of inductors for solving the problems of noises and frequencies, but, there are disadvantages that area becomes very large, and cost is increased.

FIG. 2 is a diagram illustrating a configuration example of another polyphase clock generating circuit. The polyphase clock generating circuit in FIG. 2 corresponds to the polyphase clock generating circuit in FIG. 1 to which a delay line 201, a phase detector 202 and a low-pass filter 203 are added. The delay line 201, the phase detector 202 and the low-pass filter 203 configure a delay-locked loop (DLL) circuit. Here, the oscillator 103 outputs a single-phase clock signal to the divider 104, the delay line 201 and the phase detector 202. The delay line 201 delays an output clock signal from the oscillator 103 to output a plurality of phases of clock signals φ1 to φp. The phase detector 202 compares a phase of the output clock signal from the oscillator 103 and that of the clock signal φ1, for example, and outputs a difference of the phases to the low-pass filter 203. The low-pass filter 203 averages the differences of the phases to output the resultant to the delay line 201. The delay line 201 generates and outputs a plurality of phases of clock signals φ1 to φp whose phases are adjusted so that the difference of the phases output by the low-pass filter 203 becomes small. Through processing of the delay-locked loop circuit, the phase of the clock signal φ1 is soon converged to the same phase as that of the reference clock signal CLK, and the clock signal φ1 is locked.

The polyphase clock generating circuit in FIG. 2 has an advantage that the noise characteristic of the phase-locked loop circuit can be improved by configuring the oscillator 103 using one inductor. However, since the polyphase clock generating circuit in FIG. 2 needs the two low-pass filters 102 and 203, there is a disadvantage that a circuit area becomes very large.

Further, there is known a time-to-digital converter in which a coarse time converter, a first fine time register and a second fine time register are provided, and a coarse time conversion and a fine time conversion are combined (refer to Patent Document 1 and Patent Document 2, for example).

Patent Document 1: Japanese National Publication of International Patent Application No. 2009-527157

Patent Document 2: Japanese National Publication of International Patent Application No. 2009-527158

SUMMARY

A clock generating circuit includes: a counter that counts a number of pulses of an oscillation clock signal existed within one cycle of a reference clock signal; a first time-to-digital converter that generates a plurality of phases of first clock signals by relatively delaying the oscillation clock signal with respect to the reference clock signal using a plurality of first delay elements, and outputs values of the plurality of phases of first clock signals at an edge point of the reference clock signal as a first digital value; a second time-to-digital converter that generates a plurality of phases of second clock signals by relatively delaying the oscillation clock signal with respect to the reference clock signal using a plurality of second delay elements each having a delay time shorter than a delay time of each of the first delay elements, and outputs values of the plurality of phases of second clock signals at the edge point of the reference clock signal as a second digital value; a third time-to-digital converter that generates a plurality of phases of third clock signals by relatively delaying the first clock signal delayed by the plurality of first delay elements with respect to the reference clock signal using a plurality of third delay elements each having a delay time which is the same as the delay time of each of the second delay elements, and outputs values of the plurality of phases of third clock signals at the edge point of the reference clock signal as a third digital value; a delay control unit that outputs a delay control signal based on a difference between a cycle of the oscillation clock signal obtained based on at least the first digital value and the third digital value and a target cycle; and an oscillator that generates, based on a cycle of the reference clock signal obtained based on a count number of the counter and the first to third digital values, the oscillation clock signal whose cycle is 1/m (m is an integer of 2 or more) of the cycle of the reference clock signal, in which the delay time of each of the plurality of first delay elements in the first time-to-digital converter is changed in accordance with the delay control signal output by the delay control unit, and the first time-to-digital converter outputs the plurality of phases of first clock signals.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram illustrating a configuration example of a polyphase clock generating circuit;

FIG. 2 is a diagram illustrating a configuration example of another polyphase clock generating circuit;

FIG. 3A is a diagram illustrating a configuration example of a polyphase clock generating circuit using a digital phase-locked loop circuit;

FIG. 3B is a diagram illustrating a configuration example of a time-to-digital converter in FIG. 3A;

FIG. 5 is a timing chart for explaining an operation example of a polyphase clock generating circuit;

FIG. 9B is a block diagram illustrating a configuration example of the time-to-digital converter;

FIG. 13 is a time chart illustrating a state after the calibration in the calibration circuit is performed;

FIG. 14A is a diagram illustrating a configuration example of a circuit for normalizing fine time-to-digital converters to a coarse time-to-digital converter;

FIG. 14B is a diagram illustrating another configuration example of the circuit for normalizing the fine time-to-digital converters to the coarse time-to-digital converter;

FIG. 16A is a diagram illustrating an example of convergence of a locked state of phase-locked loop circuit;

FIG. 17B is a time chart illustrating an oscillation clock signal after an addition of offset phase;

FIG. 18 is a diagram illustrating a configuration example of a polyphase clock generating circuit according to a first embodiment;

FIG. 21 is a diagram illustrating a configuration example of a polyphase clock generating circuit according to a sixth embodiment.

DESCRIPTION OF EMBODIMENTS (First Embodiment)

FIG. 3A is a diagram illustrating a configuration example of a polyphase clock generating circuit using a digital phase-locked loop circuit, and FIG. 5 is a timing chart for explaining an operation example of the polyphase clock generating circuit. A counter 306 counts a number of pulses EC of an oscillation clock signal CLK2 existed within one cycle of a reference clock signal CLK1. For example, the counter 306 counts a number of rising edges of the oscillation clock signal CLK2 existed within one cycle of the reference clock signal CLK1, to thereby count the number of pulses EC. For example, in a case of FIG. 5, the number of pulses EC is "8". A time-to-digital converter (TDC) 301 makes the reference clock signal CLK1 and the oscillation clock signal CLK2 to be input therein, and generates a plurality of phases of clock signals φβ1 to φβp.

Figure 4:
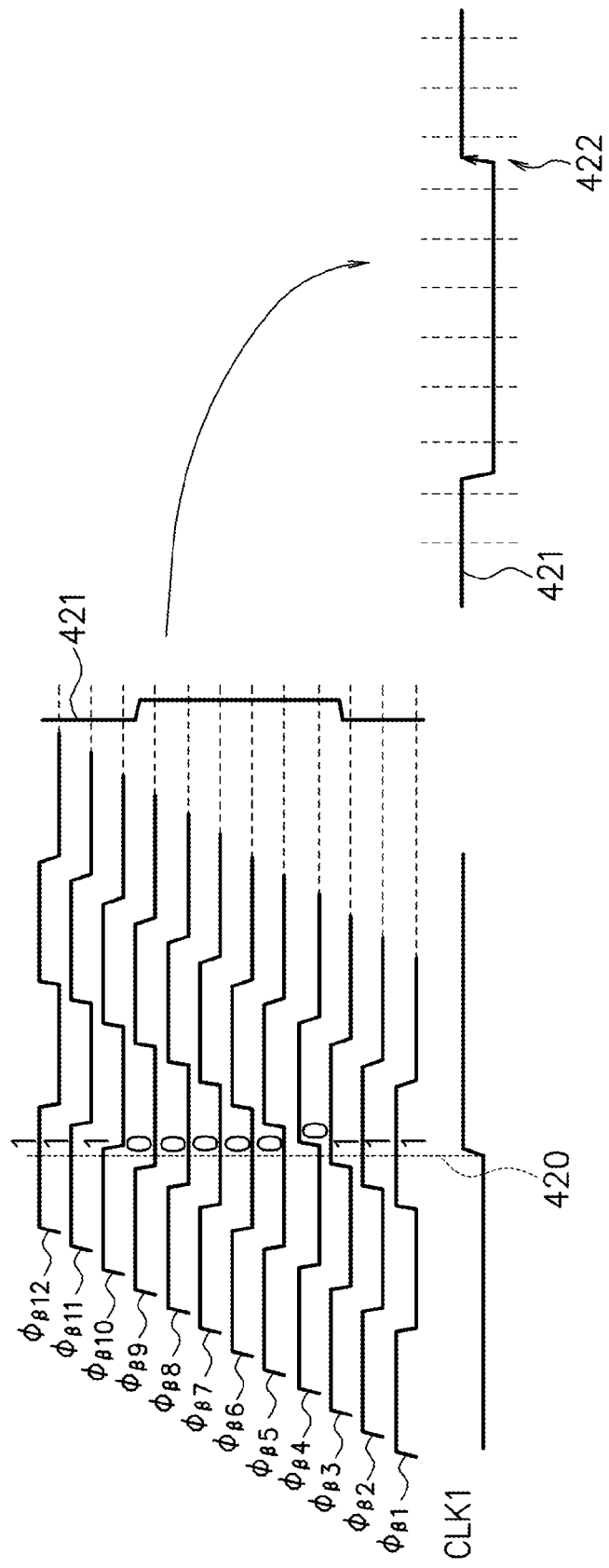
FIG. 4 is a timing chart illustrating an example of polyphase clock signals.

FIG. 3B is a diagram illustrating a configuration example of the time-to-digital converter 301 in FIG. 3A, and FIG. 4 is a timing chart illustrating an example of the polyphase clock signals φβ1 to φβp. In this case, an example in which p is 12 is illustrated. A series-connected circuit of a plurality of delay elements 311 to 313 and the like sequentially delays the oscillation clock signal CLK2. Each of the delay elements 311 to 313 and the like delays an input signal and outputs the delayed input signal. The clock signal φβ1 corresponds to a signal which is the same as the oscillation clock signal CLK2. The clock signal φβ2 is an output signal of the delay element 311. The clock signal φβ3 is an output signal of the delay element 312. Each phase difference of the clock signals φβ1 to φβ12 corresponds to each delay time of the delay elements 311 to 313 and the like. Each of the delay elements 311 to 313 and the like has the same delay time. In a manner as described above, the time-to-digital converter 301 can generate, for example, the clock signals φβ1 to φβ12 of 12 phases. Each of D-type flip-flops 321 to 323 and the like latches a value of each of the clock signals φβ1 to φβ12 at a rising edge point 420 of the reference clock signal CLK1, and outputs a binary digital value from a Q terminal. For example, the D-type flip-flop 321 latches the value of the clock signal φβ1 at the rising edge point 420 of the reference clock signal CLK1, and outputs a digital value of "1" from the Q terminal. Accordingly, for example, the Q terminals of the D-type flip-flops 321 to 323 and the like output a digital value 421 of "111000000111", as illustrated in FIG. 4. A change point 422 is a point at which the digital value 421 is changed from "0" to "1". This change point 422 corresponds to a phase difference of the oscillation clock signal CLK2 with respect to the reference clock signal CLK1. A decoder 302 in FIG. 3A detects the phase difference corresponding to the change point 422.

In FIG. 5, the oscillation clock signal CLK2 can be represented by a resolution of unit delay amount of 0 to 24, for example. The unit delay amount of 0 to 24 corresponds to 24 pieces of delay elements 311 to 313 and the like, and "1" of the unit delay amount corresponds to a delay time of one piece of delay element. A rising edge of the oscillation clock signal CLK2 is detected as a unit delay amount of "3", due to a quantization error. A phase difference PE1 corresponding thereto corresponds to a phase difference at the change point 422 in FIG. 4, and represents a phase difference of the oscillation clock signal CLK2 with respect to the reference clock signal CLK1. In a manner as described above, the decoder 302 detects the phase difference PE1 of the rising edge of the oscillation clock signal CLK2 with respect to a first rising edge of the reference clock signal CLK1, and detects, in a similar manner, a phase difference PE2 of a rising edge of the oscillation clock signal CLK2 with respect to a second rising edge of the reference clock signal CLK1.

Due to the quantization error, a first rising edge of the oscillation clock signal CLK2 is detected as a unit delay amount of "3", and a second rising edge of the oscillation clock signal CLK2 is detected as a unit delay amount of "16". Therefore, a cycle Tv of the oscillation clock signal CLK2 corresponds to a unit delay amount of 16−3=13.

The reference clock signal CLK1 has a cycle Tref from a rising edge at a timing t2 to a rising edge at a next timing t2. The number of pulses EC includes a quantization error, and is a number of pulses of the oscillation clock signal CLK2 from a timing t1 to a next timing t1 at maximum.

Next, explanation will be made on a detection method of the cycle Tref of the reference clock signal CLK1. The cycle Tref is represented by the following equation (1) based on the number of pulses EC and phase differences PF1 and PF2.

$$Tref = EC - PF1 + PF2 \quad (1)$$

Here, the phase difference PF1 is represented by the following equation (2) based on the cycle Tv of the oscillation clock signal and the phase difference PE1.

$$PF1 = Tv - PE1 \quad (2)$$

Further, the phase difference PF2 is represented by the following equation (3) based on the cycle Tv of the oscillation clock signal and the phase difference PE2.

$$PF2 = Tv - PE2 \quad (3)$$

The cycle Tv corresponds to, for example, the unit delay amount of "13", as described above. Further, the phase difference PE1 corresponds to the unit delay amount of "3", for example. When the phase difference PE1 is normalized to a ratio of the cycle Tv, the phase difference PE1 is represented by a unit delay amount of "3/13". In like manner, normalization of the phase difference PE2 is also conducted. After the normalization, the decoder 302 and an adder 303 calculate the cycle Tref of the reference clock signal CLK1 based on the above-described equation (1). The adder 303 outputs the cycle Tref of the reference clock signal CLK1 to a first low-pass filter 304. The first low-pass filter 304 averages the cycles Tref of the reference clock signal CLK1 through digital low-pass filtering, and outputs the resultant. An oscillator 305 generates, based on the cycle Tref of the reference clock signal CLK1 output from the first low-pass filter 304, the oscillation clock signal CLK2 whose cycle is 1/m (m is an integer of 2 or more) of the cycle Tref of the reference clock signal CLK1, and outputs the oscillation clock signal CLK2 to the counter 306 and the time-to-digital converter 301 in a feedback manner. The feedback circuit is a phase-locked loop circuit. The phase difference of the oscillation clock signal CLK2 and the reference clock signal CLK1 approximates to 0, and the phase difference is converged to the vicinity of 0. Specifically, for example, the clock signal ϕβ1 is locked in a state where the phase thereof is synchronized with the phase of the reference clock signal CLK1. The polyphase clock generating circuit can output the plurality of phases of clock signals ϕβ1 to ϕβp synchronized with the phase of the reference clock signal CLK1. By using the time-to-digital converter 301, the decoder 302, the adder 303 and the first low-pass filter 304 at the subsequent stage of the time-to-digital converter 301 can be configured by digital circuits, so that it is possible to reduce the size of the polyphase clock generating circuit and to realize low power consumption.

Figure 6A:
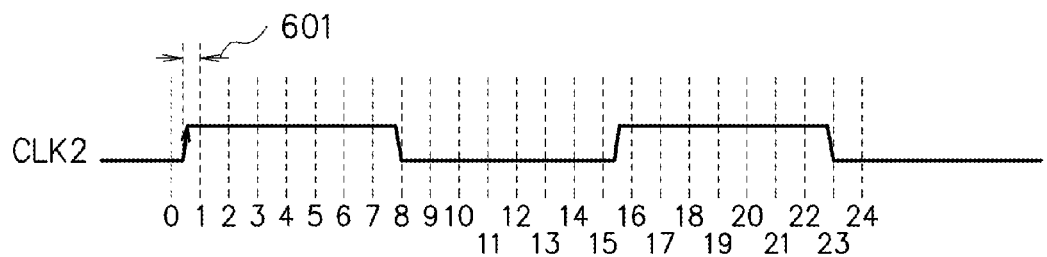
FIG. 6A is a diagram illustrating a resolution of an oscillation clock signal when a unit delay amount is relatively small.
Figure 6B:
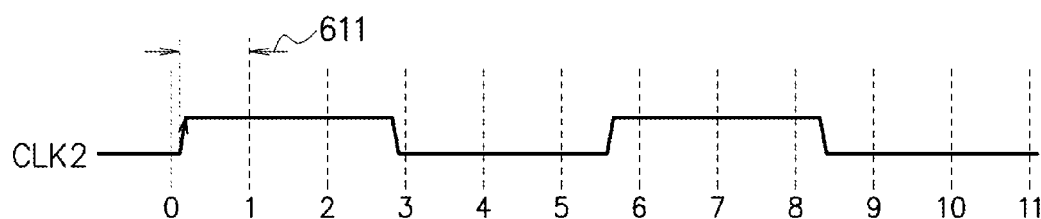
FIG. 6B is a diagram illustrating a resolution of the oscillation clock signal when the unit delay amount is relatively large.

FIG. 6A is a diagram illustrating a resolution of the oscillation clock signal CLK2 when a unit delay amount is relatively small, and FIG. 6B is a diagram illustrating a resolution of the oscillation clock signal CLK2 when the unit delay amount is relatively large. A magnitude of unit delay amount of "1" is determined by a delay time of the delay element 311 and the like in FIG. 3B. The delay time of the delay element 311 and the like dynamically changes depending on a process condition, a voltage and/or a temperature. Therefore, a case where the magnitude of unit delay amount of "1" is relatively small as in FIG. 6A, and a case where the magnitude of unit delay amount of "1" is relatively large as in FIG. 6B exist. FIG. 6A and FIG. 6B illustrate a state where a phase difference of the same oscillation clock signal CLK2 with respect to the reference clock signal CLK1 is detected. In both of FIG. 6A and FIG. 6B, the phase difference is detected as the unit delay amount of "1". However, a quantization error 611 in FIG. 6B becomes larger than a quantization error 601 in FIG. 6A, and deteriorates the performance. Although it is preferable to increase the resolution, since the resolution, the power consumption, and the area are in a trade-off relation, it is not possible to arbitrary set a number of phases of the output clock signals ϕβ1 to ϕβp. Further, since the delay time of the delay element 311 and the like depends on the process, the temperature and/or the voltage, the number of phases locked in the phase-locked loop circuit changes depending on conditions.

Figure 7A:
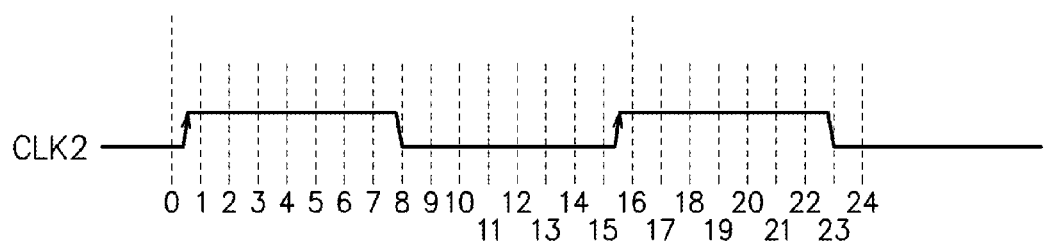
FIG. 7A is a diagram illustrating an example in which clock signals of 16 phases are generated.
Figure 7B:
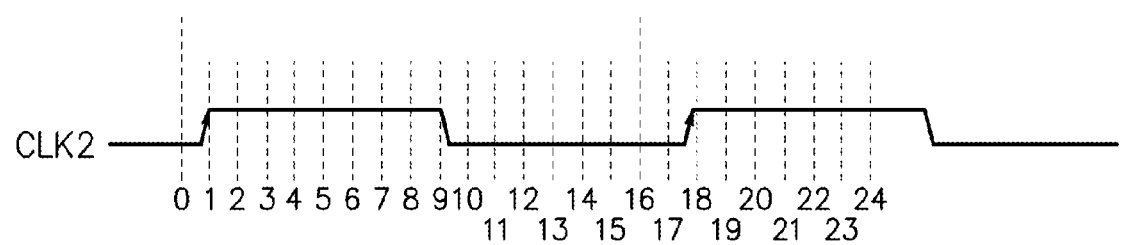
FIG. 7B is a diagram illustrating an example in which clock signals of 18 phases are generated.

FIG. 7A is a diagram illustrating an example in which clock signals ϕβ1 to ϕβ16 of 16 phases are generated, and FIG. 7B is a diagram illustrating an example in which clock signals ϕβ1 to ϕβ18 of 18 phases are generated. Since the number of phases of the output clock signals ϕβ1 to ϕβp changes depending on conditions as described above, there is a problem that it is not possible to obtain a desired number of phases.

Further, if an accuracy is set to B-bit, a number of stages of the delay element 311 and the like becomes $2^B$, so that when the accuracy is increased, the number of stages of the delay element 311 and the like is increased rapidly. In this case, when the resolution is increased by 1 bit, the number of stages of the delay element 311 and the like is doubled. Each of the power consumption and the area is also doubled. Further, it is necessary to provide a divider to perform normalization, which increases the area and the power consumption. Next, explanation will be made on a polyphase clock generating circuit for solving the above-described problems.

Figure 8A:
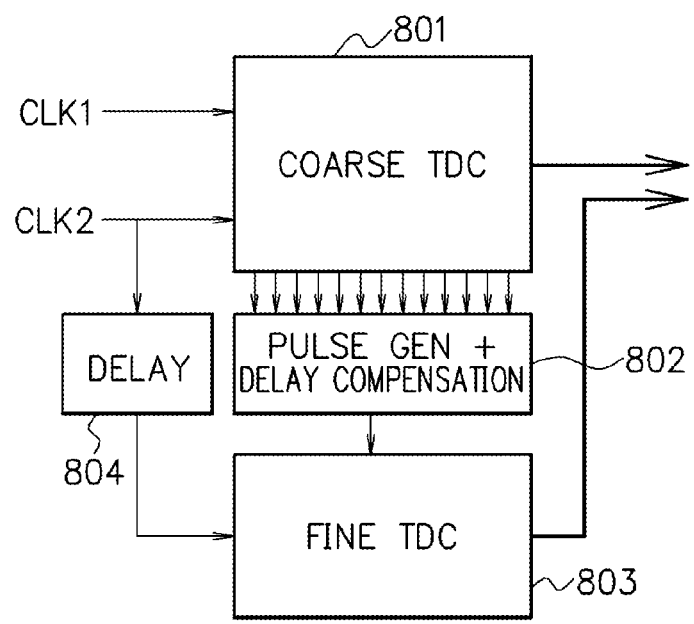
FIG. 8A is a diagram illustrating a configuration example of a polyphase clock generating circuit that uses a two-stage time-to-digital converter.
Figure 8B:
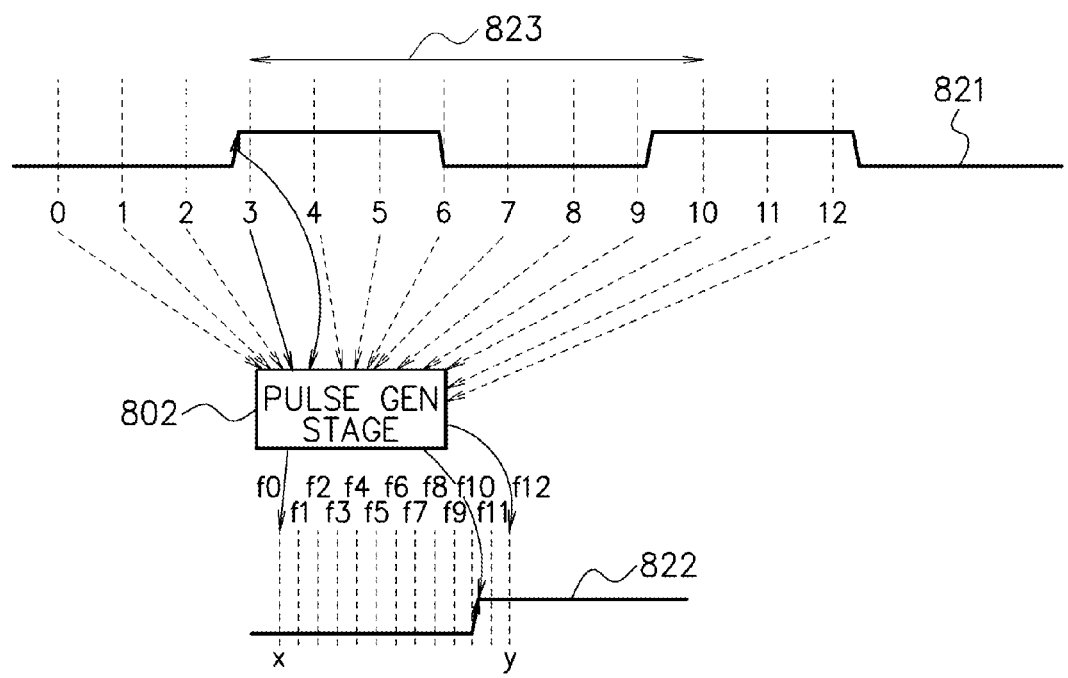
FIG. 8B is a diagram for explaining an operation of the polyphase clock generating circuit in FIG. 8A.

FIG. 8A is a diagram illustrating a configuration example of a polyphase clock generating circuit using a two-stage time-to-digital converter, and FIG. 8B is a diagram for explaining an operation of the polyphase clock generating circuit. The time-to-digital converter has two stages of a coarse time-to-digital converter 801 and a fine time-to-digital converter 803. The coarse time-to-digital converter 801 has a configuration similar to that in FIG. 3B, and since a delay time of each of delay elements 311 to 313 and the like is relatively long, a cycle 823 of an oscillation clock signal 821 is detected at a low resolution in which a magnitude of unit delay amount of "1" is large.

A stage (pulse generator and delay compensator) 802 is provided between the coarse time-to-digital converter 801 and the fine time-to-digital converter 803. A delay circuit 804 delays the oscillation clock signal CLK2 by a period of time which is the same as a delay time of the stage 802, and outputs the resultant to the fine time-to-digital converter 803, thereby compensating a phase between the coarse time-to-digital converter 801 and the fine time-to-digital converter 803. The fine time-to-digital converter 803 has a configuration similar to that in FIG. 3B, and since a delay time of each of delay elements 311 to 313 and the like is relatively short, a phase difference of an oscillation clock signal 822 is detected at a high resolution in which a magnitude of unit delay amount of "1" is small. For example, in the oscillation clock signal 822, x corresponds to a unit delay amount of "2" of the oscillation clock signal 821, and y corresponds to a unit delay amount of "3" of the oscillation clock signal 821. A phase between a unit delay amount of "f0" and that of "f1" corresponds to each delay time of the delay elements 311 to 313 and the like of the fine time-to-digital converter 803.

In the oscillation clock signal 821, the cycle 823 corresponds to a unit delay amount of 10−3=7, for example. Therefore, a phase difference of the oscillation clock signal CLK2 with respect to the reference clock signal CLK1 is represented by 2/(10−3)+(f11/f12)×1/(10−3). Here, "2" is a unit delay amount of the phase difference of the oscillation clock signal 821. (10−3) is a unit delay amount of the cycle 823 described above. "f11" is a unit delay amount of the phase difference of the oscillation clock signal 822. "f12" is a magnitude of unit delay amount of the oscillation clock signal 822 corresponding to a magnitude of unit delay amount of "1" of the oscillation clock signal 821.

When an accuracy of the coarse time-to-digital converter 801 is set to B1-bit, and an accuracy of the fine time-to-digital converter 803 is set to B2-bit, the number of delay elements is represented by $2^{B1}+2^{B2}$. For example, in a case of 8-bit accuracy, $2^8=256$ pieces of delay elements are necessary in the circuit in FIG. 3A. On the contrary, $2^4+2^4=32$ pieces of delay elements are necessary in the circuit in FIG. 8A, and thus the number of delay elements in the circuit in FIG. 8A becomes smaller than that of the circuit in FIG. 3A.

Further, when the accuracy is increased from 7-bit accuracy to 8-bit accuracy, the number of delay elements in the circuit in FIG. 3A is increased from 128 to 256. However, in the circuit in FIG. 8A, if the accuracy of the coarse time-to-digital converter 801 and the accuracy of the fine time-to-digital converter 803 are tentatively set to 4-bit accuracy and 3-bit accuracy, respectively, and if the accuracy of the fine time-to-digital converter 803 is increased by 1 bit, the number of delay elements is increased from 16+8=24 to 16+16=32. In the circuit in FIG. 8A, the number of delay elements is decreased, so that the area and the power consumption are reduced.

However, there are two problems in the circuit in FIG. 8A. The first problem is that linearity is reduced due to a mismatch of delay between the stage 802 and the delay circuit 804. The second problem is that the normalized value of the coarse time-to-digital converter 801 has only a resolution of the coarse time-to-digital converter 801, so that a normalized quantization noise is high, and even if there is provided a resolution of the fine time-to-digital converter 803, almost all of effective resolution after the normalization is determined by the accuracy of the coarse time-to-digital converter 801. Hereinafter, a polyphase clock generating circuit for solving the above-described problems will be described.

FIG. 18 is a diagram illustrating a configuration example of a polyphase clock generating circuit according to a first embodiment. A counter 306 counts a number of pulses EC of an oscillation clock signal CLK2 existed within one cycle of a reference clock signal CLK1, as illustrated in FIG. 5. For example, the counter 306 counts a number of rising edges of the oscillation clock signal CLK2 existed within one cycle of the reference clock signal CLK1, to thereby count the number of pulses EC. For example, in the case of FIG. 5, the number of pulses EC is "8". A time-to-digital converter 1501 makes the reference clock signal CLK1 and the oscillation clock signal CLK2 to be input therein, and generates a plurality of phases of low-resolution clock signals φc1 to φcp and a plurality of phases of high-resolution clock signals φf1 to φfp, φg1 to φgp.

Figure 9A:
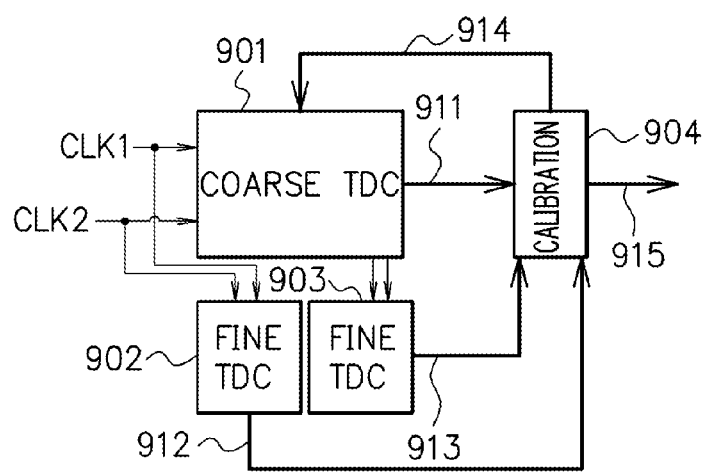
FIG. 9A is a block diagram illustrating a configuration example of a time-to-digital converter.
Figure 9C:
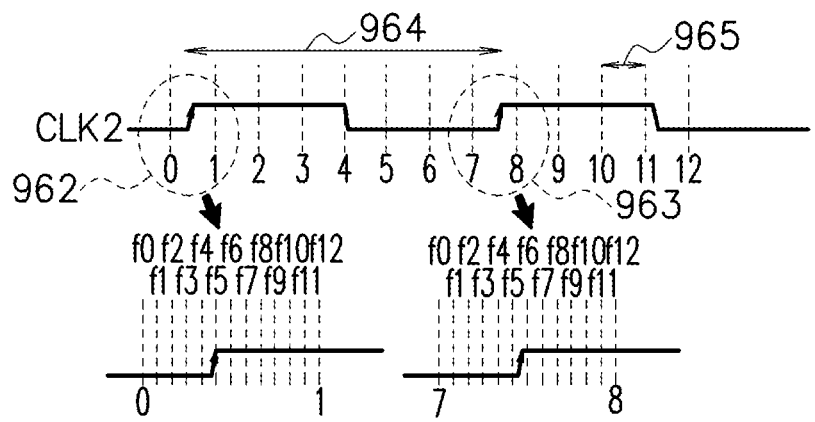
FIG. 9C is a time chart for explaining an operation example of the time-to-digital converter.

Each of FIG. 9A and FIG. 9B is a block diagram illustrating a configuration example of the time-to-digital converter 1501, and FIG. 9C is a time chart for explaining an operation example of the time-to-digital converter 1501. The time-to-digital converter 1501 has a first time-to-digital converter 901, a second time-to-digital converter 902 and a third time-to-digital converter 903.

First, the first time-to-digital converter 901 will be described. The first time-to-digital converter 901 is a coarse time-to-digital converter, and has first delay elements 921 to 928 and the like each having a relatively long delay time. A buffer 920 amplifies the oscillation clock signal CLK2. A series-connected circuit of the first delay elements 921 to 928 and the like is connected to an output terminal of the buffer 920. The first delay elements 921 to 928 and the like sequentially delay the oscillation clock signal CLK2. Each of the first delay elements 921 to 928 and the like delays an input signal and outputs the delayed input signal. The clock signal φc1 corresponds to a signal having a phase which is the same as that of the oscillation clock signal CLK2. The clock signal φc2 is an output signal of the delay element 921. The clock signal φc3 is an output signal of the delay element 922. Each phase difference of the clock signals φc1 to φcp corresponds to each delay time of the first delay elements 921 to 928 and the like. Each of the first delay elements 921 to 928 and the like has the same delay time, and the delay time is changed by a delay control signal 914. In a manner as described above, the first time-to-digital converter 901 generates the plurality of phases of low-resolution clock signals φc1 to φcp. D-type flip-flops 931 to 938 and the like latch values of the clock signals φc1 to φcp at the rising edge point 420 of the reference clock signal CLK1, and output a binary first digital value 911 from Q terminals, similar to FIG. 4. As described above, the first time-to-digital converter 901 generates the plurality of phases of first clock signals φc1 to φcp by relatively delaying the oscillation clock signal CLK2 with respect to the reference clock signal CLK1 using the plurality of first delay elements 921 to 928, and outputs the values of the plurality of phases of first clock signals φc1 to φcp at the edge point 420 of the reference clock signal CLK1 as the first digital value 911. In the first time-to-digital converter 901, it is possible to vary a magnitude of unit delay amount 965 of the oscillation clock signal CLK2 as illustrated in FIG. 9C, by controlling the delay time of each of the delay elements 921 to 928. A phase between the unit delay amount of "0" and that of "1" of the oscillation clock signal CLK2 corresponds to the delay time of the first delay element 921.

Next, the second time-to-digital converter 902 will be described. The second time-to-digital converter 902 is a fine time-to-digital converter, and has second delay elements 941 to 943 and the like each having a delay time shorter than that of each of the first delay elements 921 to 928 and the like. A series-connected circuit of the second delay elements 941 to 943 and the like is connected to the output terminal of the buffer 920. The second delay elements 941 to 943 and the like sequentially delay the oscillation clock signal CLK2. Each of the second delay elements 941 to 943 and the like delays an input signal and outputs the delayed input signal. The clock signal φf1 corresponds to a signal having a phase which is the same as that of the oscillation clock signal CLK2. The clock signal φf2 is an output signal of the delay element 941. The clock signal φf3 is an output signal of the delay element 942. Each phase difference of the clock signals φf1 to φfp corresponds to each delay time of the second delay elements 941 to 943 and the like. Each of the second delay elements 941 to 943 and the like has the same delay time. In a manner as described above, the second time-to-digital converter 902 generates the plurality of phases of high-resolution clock signals φf1 to φfp. D-type flip-flops 951 to 953 and the like latch values of the clock signals φf1 to φfp at the rising edge point 420 of the reference clock signal CLK1, and output a binary second digital value 912 from Q terminals, similar to FIG. 4. As described above, the second time-to-digital converter 902 generates the plurality of phases of second clock signals φf1 to φfp by relatively delaying the oscillation clock signal CLK2 with respect to the reference clock signal CLK1 using the plurality of second delay elements 941 to 943 and the like each having the delay time shorter than that of each of the first delay elements 921 to 928 and the like, and outputs the values of the plurality of phases of second clock signals φf1 to φfp at the edge point 420 of the reference clock signal CLK1 as the second digital value 912. The second time-to-digital converter 902 is a circuit for detecting a phase of a first rising edge 962 of the oscillation clock signal CLK2, as illustrated in FIG. 9C. A phase between the unit delay amount of "f0" and that of "f1" of the oscillation clock signal CLK2 corresponds to the delay time of the second delay element 941.

Next, the third time-to-digital converter 903 will be described. The third time-to-digital converter 903 is a fine time-to-digital converter similar to the second time-to-digital converter 902, and has third delay elements 981 to 983 and the like each having a delay time which is the same as that of each of the second delay elements 941 to 943 and the like. A series-connected circuit of the third delay elements 981 to 983 and the like is connected to an output terminal of the first delay element 927 (an input terminal of the first delay element 928). The third delay elements 981 to 983 and the like sequentially delay the first clock signal φc8 output by the first delay element 927. Each of the third delay elements 981 to 983 and the like delays an input signal and outputs the delayed input signal. The clock signal φg1 corresponds to a signal which is the same as the first clock signal φc8 output by the first delay element 927. The clock signal φg2 is an output signal of the delay element 981. The clock signal φg3 is an output signal of the delay element 982. Each phase difference of the clock signals φg1 to φgp corresponds to each delay time of the third delay elements 981 to 983 and the like. Each of the third delay elements 981 to 983 and the like has the same delay time. In a manner as described above, the third time-to-digital converter 903 generates the plurality of phases of high-resolution clock signals φg1 to φgp. D-type flip-flops 991 to 993 and the like latch values of the clock signals φg1 to φgp at the rising edge point 420 of the reference clock signal CLK1, and output a binary third digital value 913 from Q terminals, similar to FIG. 4. As described above, the third time-to-digital converter 903 generates the plurality of phases of third clock signals φg1 to φgp by delaying the first clock signal φc8 delayed by the plurality of first delay elements 921 to 927, using the plurality of third delay elements 981 to 983 and the like each having the delay time which is the same as that of each of the second delay elements 941 to 943 and the like, and outputs the values of the plurality of phases of third clock signals φg1 to φgp at the edge point of the reference clock signal CLK1 as the third digital value 913. The third time-to-digital converter 903 is a circuit for detecting a phase of a second rising edge 963 of the oscillation clock signal CLK2, as illustrated in FIG. 9C. A phase between the unit delay amount of "f0" and that of "f1" of the oscillation clock signal CLK2 corresponds to the delay time of the third delay element 981.

A calibration circuit 904 in FIG. 9A has a decoder 302, a subtracter 1504, a second low-pass filter 1505 and an adder 303 in FIG. 18. The calibration circuit 904 makes the first digital value 911 of the first time-to-digital converter 901, the second digital value 912 of the second time-to-digital converter 902 and the third digital value 913 of the third time-to-digital converter 903 to be input therein, and calculates a cycle 964 of the oscillation clock signal CLK2, in a similar manner to that of the method in FIG. 4 and FIG. 5. The cycle 964 is output, as a signal 915, to the first low-pass filter 304 in FIG. 18.

Concretely, the first time-to-digital converter 901 is a circuit for detecting the rising edges 962 and 963 of the oscillation clock signal CLK2 at a low resolution, as illustrated in FIG. 9C. For example, the rising edge 962 is detected as a unit delay amount of "1", and the rising edge 963 is detected as a unit delay amount of "8".

The second time-to-digital converter 902 is a circuit for detecting the first rising edge 962 of the oscillation clock signal CLK2 at a high resolution, as illustrated in FIG. 9C. For example, the rising edge 962 is detected as a unit delay amount of "f5".

The third time-to-digital converter 903 is a circuit for detecting the second rising edge 963 of the oscillation clock signal CLK2 at a high resolution, as illustrated in FIG. 9C. For example, the rising edge 963 is detected as a unit delay amount of "f6".

In FIG. 18, the decoder 302 and the adder 303 calculate, after the normalization, the cycle Tref of the reference clock signal CLK1 based on a count number EC of the counter 306 and the first to third digital values 911 to 913 through the above-described equation (1), similar to FIG. 5. The adder 303 outputs the cycle Tref of the reference clock signal CLK1 to the first low-pass filter 304. The first low-pass filter 304 connected to an input terminal of an oscillator 305 averages the cycles Tref of the reference clock signal CLK1 through digital low-pass filtering, and outputs the resultant. The oscillator 305 generates, based on the cycle Tref of the reference clock signal CLK1 output by the first low-pass filter 304, the oscillation clock signal CLK2 whose cycle is 1/m (m is an integer of 2 or more) of the cycle Tref of the reference clock signal CLK1, and outputs the oscillation clock signal CLK2 to the counter 306 and the time-to-digital converter 1501 in a feedback manner. The feedback circuit is a phase-locked loop circuit. The phase difference of the oscillation clock signal CLK2 and the reference clock signal CLK1 approximates to 0, and the phase difference is converged to the vicinity of 0. Specifically, for example, the clock signal φc1 is locked in a state where the phase thereof is synchronized with the phase of the reference clock signal CLK1. The polyphase clock generating circuit can output the plurality of phases of clock signals φc1 to φcp synchronized with the phase of the reference clock signal CLK1. By using the time-to-digital converter 1501, the decoder 302, the adder 303, the first low-pass filter 304, the subtracter 1504 and the second low-pass filter 1505 at the subsequent stage of the time-to-digital converter 1501 can be configured by digital circuits, so that it is possible to reduce the size of the polyphase clock generating circuit and to realize the low power consumption.

Further, the calibration circuit 904 in FIG. 9A outputs a delay control signal 914 to the first delay elements 921 to 928 and the like of the first time-to-digital converter 901. The delay time of each of the first delay elements 921 to 928 and the like is changed in accordance with the delay control signal 914.

Figure 10A:
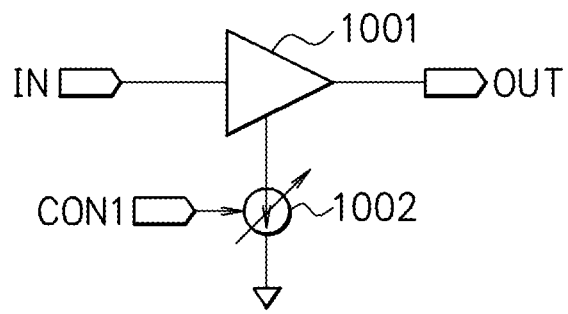
FIG. 10A is a diagram illustrating a configuration example of a variable delay element in FIG. 9B.

FIG. 10A is a diagram illustrating a configuration example of each of variable delay elements 921 to 928 and the like in FIG. 9B. A delay element 1001 connected to a variable current source 1002, delays a signal of an input terminal IN and outputs the delayed signal to an output terminal OUT. A control terminal CON1 makes an analog delay control signal 914 in FIG. 9B to be input therein, to thereby control a current flowed through the variable current source 1002. When the current flowed through the variable current source 1002 is large, a delay time of the delay element 1001 becomes short, and when the current flowed through the variable current source 1002 is small, the delay time of the delay element 1001 becomes long.

Figure 10B:
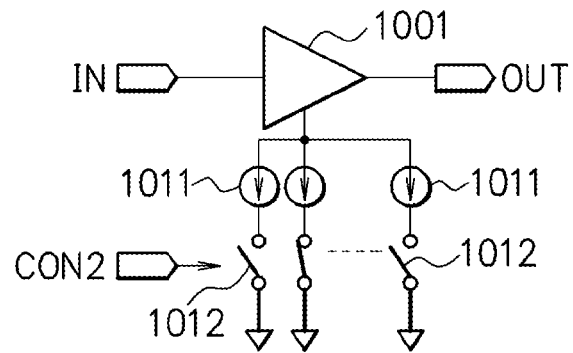
FIG. 10B is a diagram illustrating another configuration example of the variable delay element in FIG. 9B.

FIG. 10B is a diagram illustrating another configuration example of each of the variable delay elements 921 to 928 and the like in FIG. 9B. A delay element 1001 to which a plurality of sets of series-connected circuit of a current source 1011 and a switch 1012 are connected in parallel, delays a signal of an input terminal IN and outputs the delayed signal to an output terminal OUT. A control terminal CON2 makes a digital delay control signal 914 in FIG. 9B to be input therein, to thereby control on/off of the plurality of switches 1012. When a total current flowed through the plurality of current sources 1011 is large, a delay time of the delay element 1001 becomes short, and when the total current flowed through the plurality of current sources 1011 is small, the delay time of the delay element 1001 becomes long.

Figure 10C:
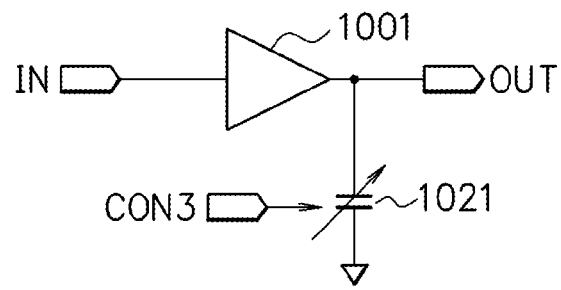
FIG. 10C is a diagram illustrating still another configuration example of the variable delay element in FIG. 9B.

FIG. 10C is a diagram illustrating still another configuration example of each of the variable delay elements 921 to 928 and the like in FIG. 9B. A delay element 1001 connected to a variable capacitor 1021, delays a signal of an input terminal IN, and outputs the delayed signal to an output terminal OUT. A control terminal CON3 makes an analog delay control signal 914 in FIG. 9B to be input therein, to thereby control a capacitance value of the variable capacitor 1021. When the capacitance value of the variable capacitor 1021 is small, a delay time of the delay element 1001 becomes short, and when the capacitance value of the variable capacitor 1021 is large, the delay time of the delay element 1001 becomes long.

Figure 10D:
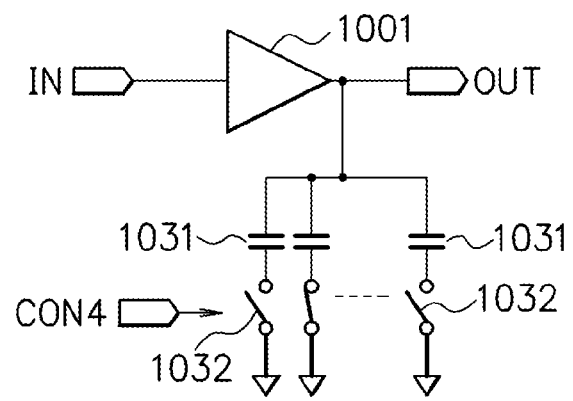
FIG. 10D is a diagram illustrating yet another configuration example of the variable delay element in FIG. 9B.

FIG. 10D is a diagram illustrating yet another configuration example of each of the variable delay elements 921 to 928 and the like in FIG. 9B. A delay element 1001 to which a plurality of sets of series-connected circuit of a capacitor 1031 and a switch 1032 are connected in parallel, delays a signal of an input terminal IN and outputs the delayed signal to an output terminal OUT. A control terminal CON4 makes a digital delay control signal 914 in FIG. 9B to be input therein, to thereby control on/off of the plurality of switches 1032. When a value of capacitor connected to the delay element 1001 is small, a delay time of the delay element 1001 becomes short, and when the value of capacitor connected to the delay element 1001 is large, the delay time of the delay element 1001 becomes long.

Figure 11A:
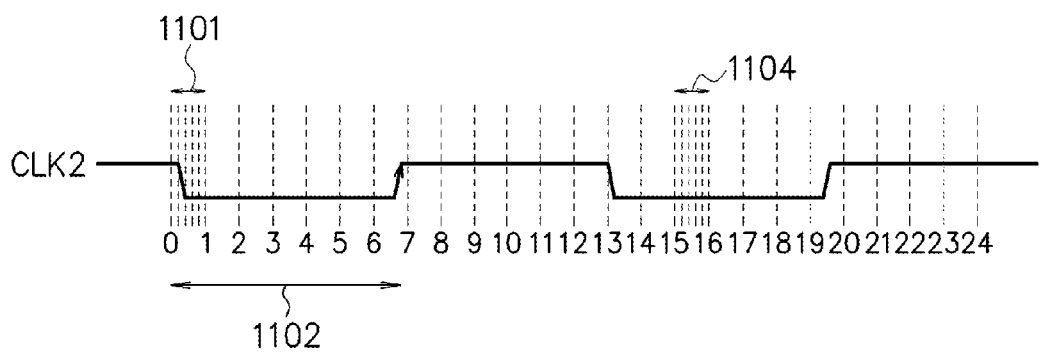
FIG. 11A is a diagram for explaining a delay time control in a calibration circuit in FIG. 9A.
Figure 11B:
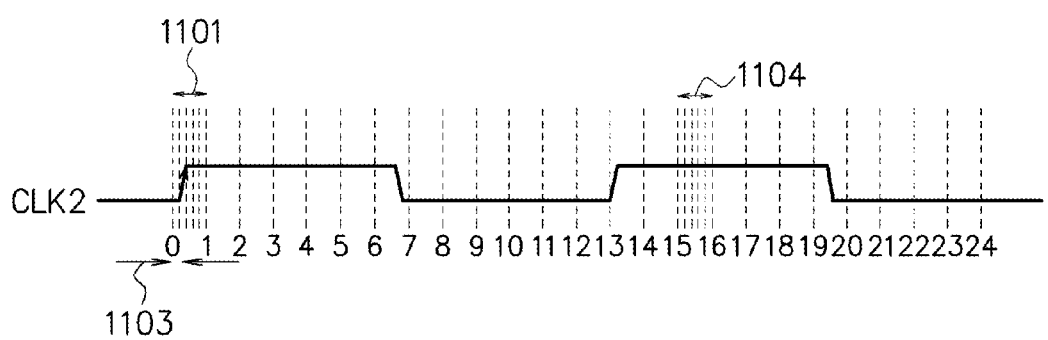
FIG. 11B is a diagram for explaining the delay time control in the calibration circuit in FIG. 9A.

FIG. 11A and FIG. 11B are diagrams for explaining a delay time control in the calibration circuit 904 in FIG. 9A. FIG. 11A is a time chart illustrating a state before the above-described phase-locked loop circuit is locked. A horizontal axis indicates a unit delay amount of the first time-to-digital converter 901. An area 1101 is an area between a unit delay amount of "0" and that of "1", and an area having a high-resolution unit delay amount of the second time-to-digital converter 902. An area 1104 is an area between a unit delay amount of "15 and that of "16", and an area having a high-resolution unit delay amount of the third time-to-digital converter 903. A rising edge of the oscillation clock signal CLK2 has a phase difference 1102 with respect to a rising edge of the reference clock signal CLK1.

FIG. 11B is a time chart illustrating a state after the above-described phase-locked loop circuit is locked and before the calibration is performed. The phase difference of the oscillation clock signal CLK2 with respect to the reference clock signal CLK1 is reduced by the phase-locked loop circuit. When the phase-locked loop circuit is locked, a phase difference 1103 of the oscillation clock signal CLK2 with respect to the reference clock signal CLK1 becomes approximately 0. In the present embodiment, an example in which first clock signals φc1 to φc16 of 16 phases are generated, will be explained. In this case, the second time-to-digital converter 902 operates in the area 1101 between the unit delay amount of "0" and that of "1", and the third time-to-digital converter 903 operates in the area 1104 between the unit delay amount of "15" and that of "16". If the first rising edge and the second rising edge of the oscillation clock signal CLK2 are positioned in the area 1101 and the area 1104, respectively, the first clock signals φc1 to φc16 of 16 phases can be generated by dividing the oscillation clock signal CLK2 into 16 by the delay elements. However, in the case of FIG. 11B, since the calibration is not yet performed, the second rising edge of the oscillation clock signal CLK2 is positioned between the unit delay amount of "13" and that of "14". In this state, first clock signals φc1 to φc14 of 14 phases are generated, and thus it is not possible to obtain desired 16 phases. As described above, the delay time of each of the first delay elements 921 to 928 and the like dynamically varies depending on the process, the temperature and/or the voltage. Therefore, the number of phases of the first clock signals φc1 to φcp can also be dynamically changed. Accordingly, by the delay time control of the calibration circuit 904 in FIG. 9A, it is possible to stably generate the first clock signals φc1 to φc16 of 16 phases.

Here, in the state where the phase-locked loop circuit is locked, phase information of the second rising edge of the oscillation clock signal CLK2 becomes cycle information of the oscillation clock signal CLK2. The decoder 302 in FIG. 18 outputs the phase information of the second rising edge of the oscillation clock signal CLK2 to the subtracter 1504 as the cycle information of the oscillation clock signal CLK2. For example, in the case of FIG. 11B, a cycle of the oscillation clock signal CLK2 corresponds to a unit delay amount of "14". The subtracter 1504 outputs a difference between the cycle detected by the decoder 302 ("14", for example) and a target cycle (target number of phases) RD ("16", for example) to the second low-pass filter 1505. The subtracter 1504 outputs a difference between the cycle of the oscillation clock signal CLK2 obtained based on at least the first digital value 911 and the third digital value 913 and the target cycle RD. The second low-pass filter 1505 is connected between the subtracter 1504 and the first time-to-digital converter 901, and outputs a signal as a result of averaging output signals of the subtracter 1504 by performing digital low-pass filtering on the output signals of the subtracter 1504, as the delay control signal 914, to the first delay elements 921 to 928 and the like in the first time-to-digital converter 901. The subtracter 1504 and the second low-pass filter 1505 configure a delay control unit. For example, in FIG. 11B, the cycle of the oscillation clock signal CLK2 is "14" which is shorter than the target cycle RD ("16", for example), so that the delay time of each of the first delay elements 921 to 928 and the like is shortened. A length of each of the areas 1101 and 1104 corresponds to the delay time of each of the first delay elements 921 to 928 and the like. As a result of this, the calibration is conducted to create a state where the first clock signals φc1 to φc16 of 16 phases can be generated, as illustrated in FIG. 12.

Figure 12:
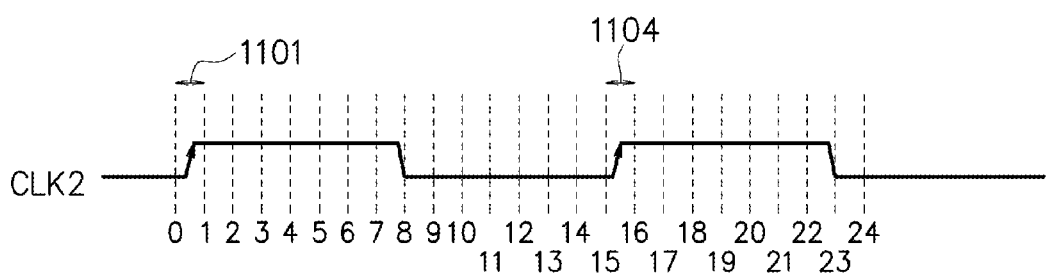
FIG. 12 is a time chart illustrating a state after the calibration in the calibration circuit is performed.

FIG. 12 and FIG. 13 are time charts each illustrating a state after the calibration in the calibration circuit 904 is performed. The first rising edge of the oscillation clock signal CLK2 is positioned in the area 1101, and the second rising edge of the oscillation clock signal CLK2 is positioned in the area 1104. Accordingly, the oscillation clock signal CLK2 can be divided into 16, resulting in that the first clock signals φc1 to φc16 of 16 phases are generated. Through the feedback loop processing of calibration, the oscillation clock signal CLK2 is locked so that the first rising edge thereof is positioned in the area 1101, and the second rising edge thereof is positioned in the area 1104. As a result of this, the number of phases of the first clock signals φc1 to φcp is locked to "16".

As illustrated in FIG. 13, since the oscillation clock signal CLK2 is locked so that the first rising edge thereof is positioned in the area 1101, the second time-to-digital converter 902 can detect the phase of the first rising edge of the oscillation clock signal CLK2. In like manner, since the oscillation clock signal CLK2 is locked so that the second rising edge thereof is positioned in the area 1104, the third time-to-digital converter 903 can detect the phase of the second rising edge of the oscillation clock signal CLK2. As described above, the present embodiment does not need the stage 802 in FIG. 8A, and it is only needed to provide the two fine time-to-digital converters 902 and 903 corresponding to the areas 1101 and 1104, so that there is no need to provide the fine time-to-digital converters corresponding to all areas of one cycle.

FIG. 14A is a diagram illustrating a configuration example of a circuit for normalizing the fine time-to-digital converters 902 and 903 to the coarse time-to-digital converter 901. The method of calculation of the phase difference using the fine time-to-digital converter 803 and the coarse time-to-digital converter 801 was described above while referring to FIG. 5. Similar to the method, the present embodiment calculates the phase difference by using the fine time-to-digital converters 902 and 903 and the coarse time-to-digital converter 901. Hereinafter, a method of normalizing the fine time-to-digital converters 902 and 903 to the coarse time-to-digital converter 901 will be explained. One first delay element 1401 corresponds to any one of the first delay elements 921 to 928 and the like in FIG. 9B. A plurality of second delay elements 1402 correspond to the second delay elements 941 to 943 and the like in FIG. 9B. The first delay element 1401 delays the reference clock signal CLK1 and outputs the delayed reference clock signal CLK1, for example. A series-connected circuit of the plurality of second delay elements 1402 delays the reference clock signal CLK1 and outputs the delayed reference clock signal CLK1, for example. A flip-flop bank 1403 having a plurality of flip-flops latches output signals of the plurality of second delay elements 1402 in synchronization with, for example, a rising edge of the output signal of the first delay element 1401, and outputs the output signals to a decoder 1404. The decoder 1404 can detect that a delay time of the first delay element 1401 corresponds to a delay time of how many of the second delay elements 1402. Specifically, it is possible to detect that a magnitude of unit delay amount of "1" of the first time-to-digital converter 901 corresponds to how many of unit delay amounts of the second time-to-digital converter 902. Accordingly, the decoder 302 can perform the normalization, and detect the phases of the first rising edge and the second rising edge of the oscillation clock signal CLK2, in a similar manner to that of FIG. 8B. Although the explanation was made by citing the case of the second time-to-digital converter 902 as an example in the above description, the same applies to the third time-to-digital converter 903.

FIG. 14B is a diagram illustrating another configuration example of the circuit for normalizing the fine time-to-digital converters 902 and 903 to the coarse time-to-digital converter 901. The circuit in FIG. 14B corresponds to the circuit in FIG. 14A to which a low-pass filter 1411 is added. Hereinafter, a point in which the circuit in FIG. 14B is different from the circuit in FIG. 14A will be explained. A second delay element 1412 is a variable delay element which is provided in place of the second delay element 1402. The decoder 1404 detects that the delay time of the first delay element 1401 corresponds to a delay time of how many of the second delay elements 1412, and outputs a difference between the number of the second delay elements 1412 and a target number to the low-pass filter 1411. The low-pass filter 1411 averages outputs of the decoder 1404 through low-pass filtering, and outputs a delay control signal to the plurality of second delay elements 1412. The delay time of each of the plurality of second delay elements 1412 is changed by the delay control signal. Through this feedback control, a state is converged to a state where the difference output by the decoder 1404 becomes 0. Accordingly, the decoder 302 in FIG. 18 can perform the normalization using the target number, and detect the phases of the first rising edge and the second rising edge of the oscillation clock signal CLK2.

As described above, the polyphase clock generating circuit in FIG. 18 directly connects the coarse time-to-digital converter 901 to the fine time-to-digital converters 902 and 903 without providing the stage 802 in FIG. 8A between the coarse time-to-digital converter 901 and the fine time-to-digital converters 902 and 903. By this connection, the mismatch of delay caused by the stage 802 is eliminated, resulting in that the linearity of characteristics is improved.

In the circuit in FIG. 18, when an accuracy of the coarse time-to-digital converter 901 is set to B1-bit, and an accuracy of the fine time-to-digital converters 902 and 903 is set to B2-bit, the number of delay elements is represented by $2^{B1}+2^{B2+1}$. For example, in a case of 8-bit accuracy, $2^8=256$ pieces of delay elements are necessary in the circuit in FIG. 3A. On the contrary, $2^4+2^{4+1}=48$ pieces of delay elements are necessary in the circuit in FIG. 18, and thus the number of delay elements in the circuit in FIG. 18 becomes smaller than that of the circuit in FIG. 3A.

Further, by using the time-to-digital converter 1501, the decoder 302, the adder 303, the first low-pass filter 304, the subtracter 1504 and the second low-pass filter 1505 at the subsequent stage of the time-to-digital converter 1501 can be configured by digital circuits, so that it is possible to reduce the size of the polyphase clock generating circuit and to realize the low power consumption.

Further, as illustrated in FIG. 14A and FIG. 14B, the normalization processing becomes simple, so that the number of bits which are necessary at the time of normalization is reduced, resulting in that the area in the circuit scale and the power consumption of the polyphase clock generating circuit are reduced.

(Second Embodiment)

Figure 15A:
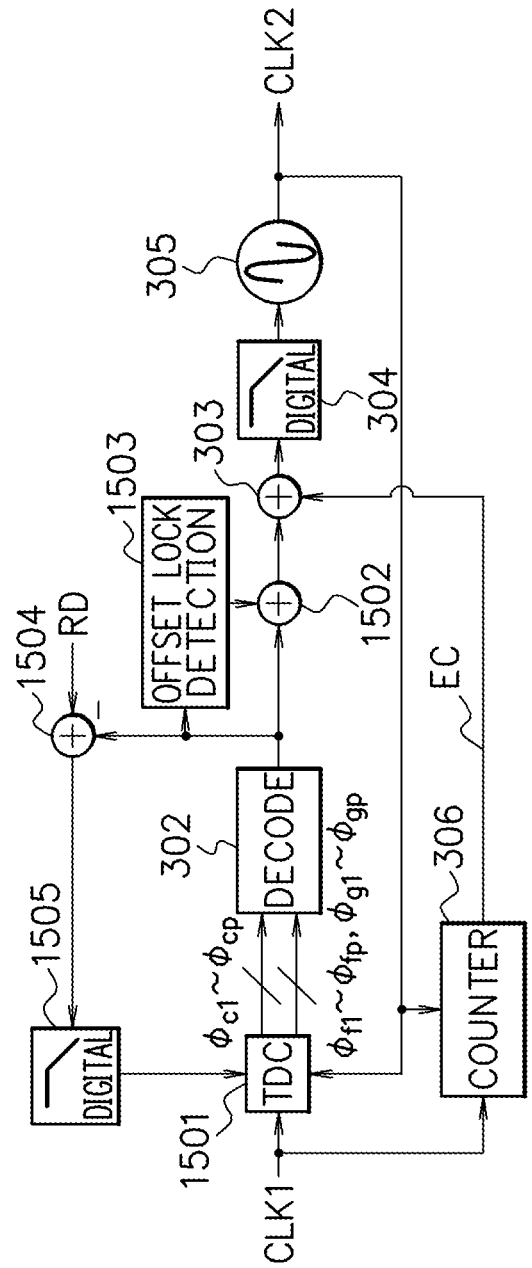
FIG. 15A is a diagram illustrating a configuration example of a polyphase clock generating circuit according to a second embodiment.

FIG. 15A is a diagram illustrating a configuration example of a polyphase clock generating circuit according to a second embodiment. The circuit in FIG. 15A corresponds to the circuit in FIG. 18 to which an offset lock detector 1503 and an adder 1502 are added. Hereinafter, a point in which the present embodiment is different from the first embodiment will be described. When the offset lock detector 1503 detects an offset lock based on an output signal of the decoder 302, it outputs an offset phase to the adder 1502. The adder 1502 adds the offset phase to the output signal of the decoder 302, and outputs the resultant to the adder 303. Hereinafter, details of an operation of the above will be described.

Figure 15B:
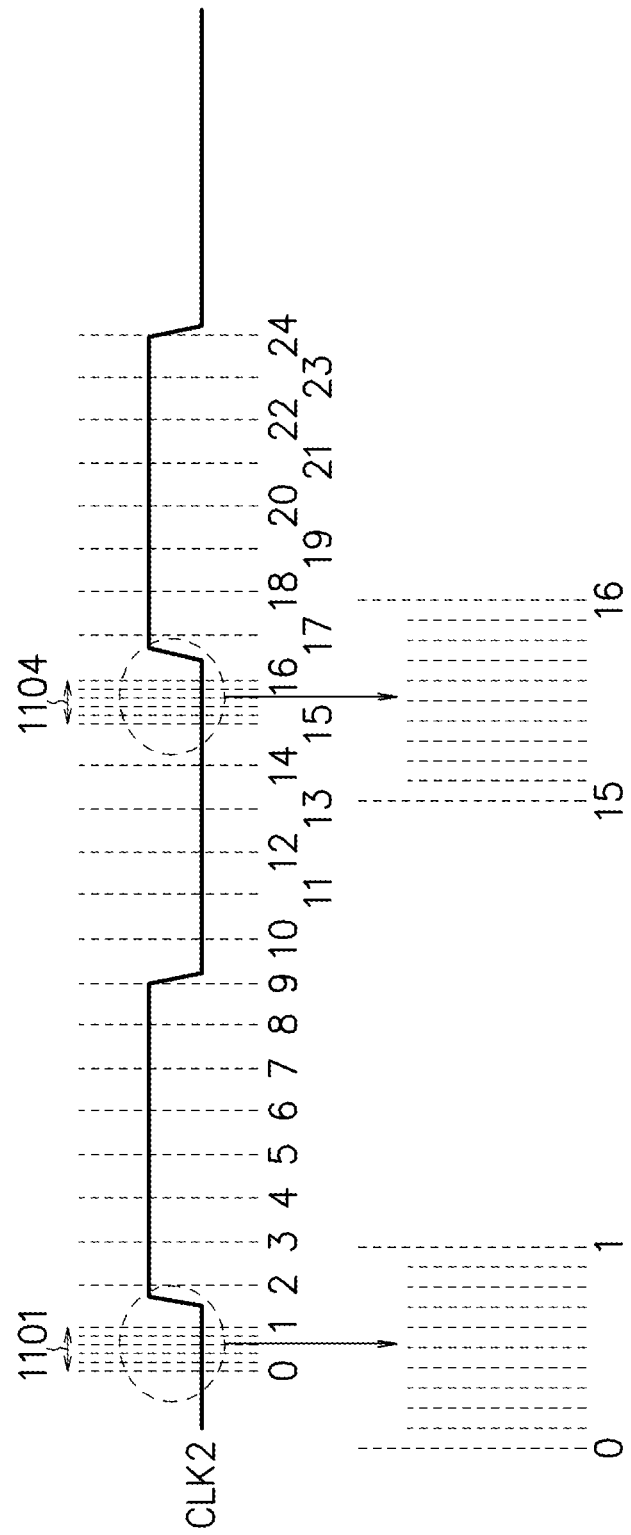
FIG. 15B is a diagram for explaining an offset lock.

FIG. 15B is a diagram for explaining the offset lock. When the time-to-digital converter 1501 itself has an offset phase, the phase-locked loop circuit is locked in a state where the oscillation clock signal CLK2 has an offset phase. For example, the oscillation clock signal CLK2 is locked in a state where the first rising edge thereof is positioned in an area between a unit delay amount of "1" and that of "2", and the second rising edge thereof is positioned in an area between a unit delay amount of "16" and that of "17". In this state, it is not possible for the second time-to-digital converter 902 and the third time-to-digital converter 903 to detect the rising edges of the oscillation clock signal CLK2. In order to remove the offset phase, it is necessary to perform calibration. When the first rising edge of the oscillation clock signal CLK2 is not positioned in the area 1101 and the second rising edge of the oscillation clock signal CLK2 is not positioned in the area 1104 under the state where the phase-locked loop circuit is locked, the offset lock detector 1503 judges that there exists an offset phase, and outputs the offset phase to the adder 1502. The adder 1502 adds the offset phase to the output signal of the decoder 302, and outputs the resultant to the adder 303. Specifically, when the phase-locked loop circuit is locked in a state where no edges of the oscillation clock signal CLK2 exist in the second digital value 912 and the third digital value 913, the offset lock detector 1503 and the adder 1502 give the offset phase to the cycle input into the oscillator 305. Through this calibration, the offset phase is removed, and correction is made to create a state where the first rising edge of the oscillation clock signal CLK2 is positioned in the area 1101, and the second rising edge of the oscillation clock signal CLK2 is positioned in the area 1104. By the removal of the offset phase, it becomes possible to perform a normal operation.

(Third Embodiment)

Figure 17A:
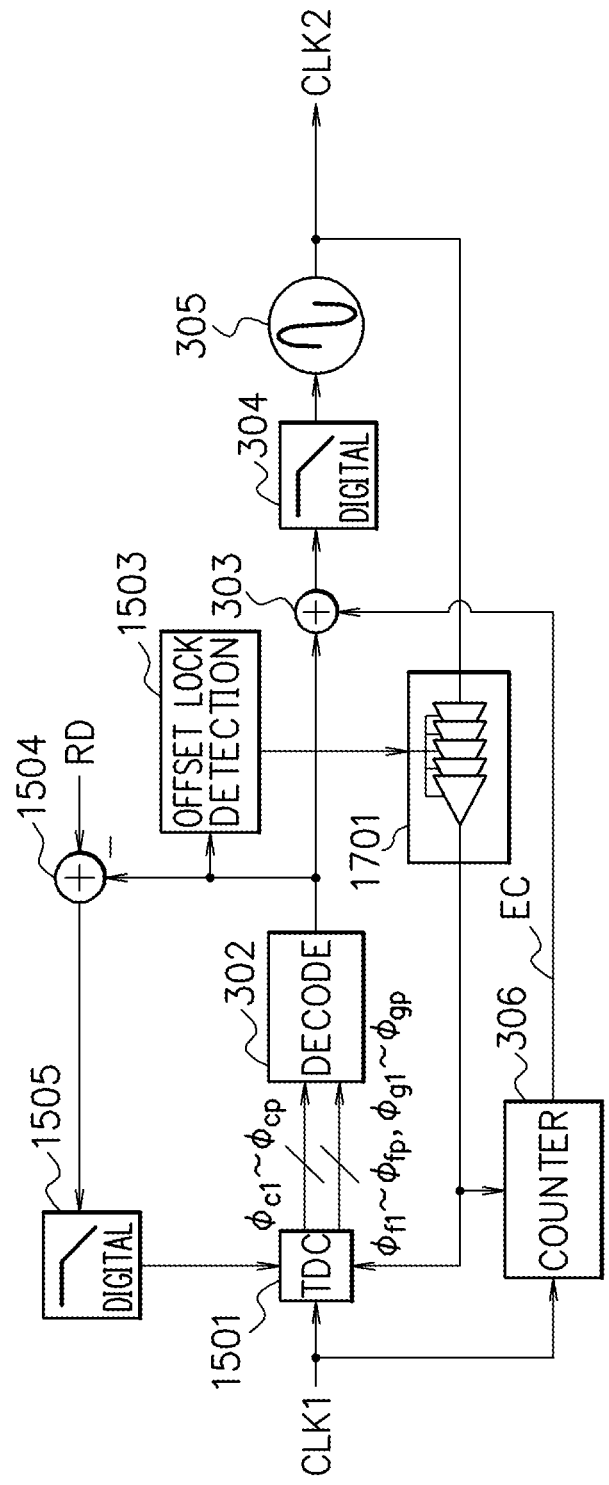
FIG. 17A is a diagram illustrating a configuration example of a polyphase clock generating circuit according to a third embodiment.

FIG. 17A is a diagram illustrating a configuration example of a polyphase clock generating circuit according to a third embodiment. The circuit in FIG. 17A corresponds to the circuit in FIG. 15A in which a variable delay circuit 1701 is provided in place of the adder 1502. Hereinafter, a point in which the present embodiment is different from the second embodiment will be described. When the offset lock detector 1503 detects an offset lock, it outputs a delay control signal corresponding to the offset phase to the variable delay circuit 1701. The variable delay circuit 1701 delays the oscillation clock signal CLK2 output by the oscillator 305 by a delay time in accordance with the delay control signal, and outputs the delayed oscillation clock signal CLK2 to the counter 306 and the time-to-digital converter 1501. Hereinafter, details of operation of the above will be described.

Figure 16B:
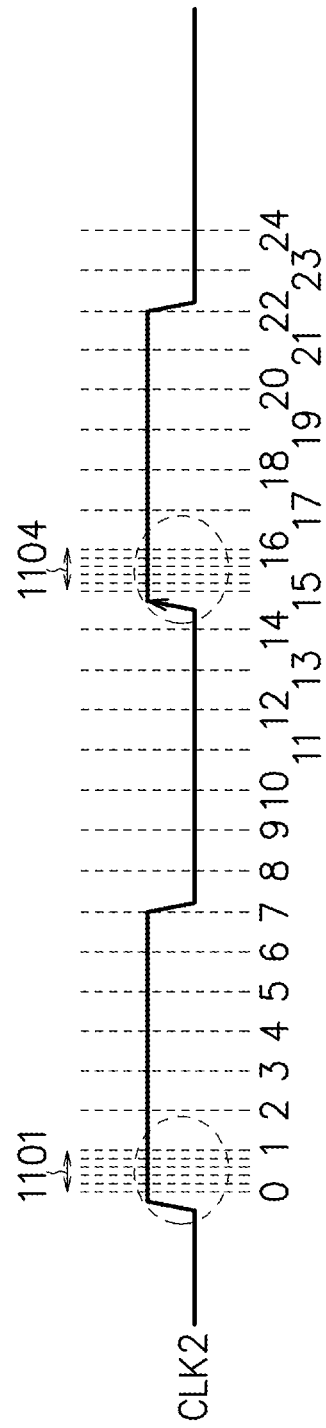
FIG. 16B is a diagram illustrating an example of convergence of a locked state of phase-locked loop circuit.

FIG. 16A and FIG. 16B are diagrams illustrating an example of convergence of the locked state of the phase-locked loop circuit. In the phase-locked loop circuit, the phase difference of the oscillation clock signal CLK2 is converged while oscillating in the vicinity of 0. As a result of this, a case where the first rising edge of the oscillation clock signal CLK2 is shifted to a plus side of a unit delay amount of "0" as illustrated in FIG. 16A, and a case where the first rising edge of the oscillation clock signal CLK2 is shifted to a minus side of the unit delay amount of "0" as illustrated in FIG. 16B exist. In the state of FIG. 16A, the first rising edge of the oscillation clock signal CLK2 is positioned in the area 1101, and the second rising edge of the oscillation clock signal CLK2 is positioned in the area 1104, so that a normal operation is conducted. On the contrary, in the state of FIG. 16B, the first rising edge of the oscillation clock signal CLK2 is not positioned in the area 1101, and the second rising edge of the oscillation clock signal CLK2 is not positioned in the area 1104, so that it is not possible for the fine time-to-digital converters 902 and 903 to detect the rising edges of the oscillation clock signal CLK2. In the case of using the counter 306, when the phase difference becomes minus as in FIG. 16B, the first rising edge of the oscillation clock signal CLK2 is detected between a unit delay amount of "14" and that of "15". In order to solve this problem, it is also possible to add the offset phase using the circuit in FIG. 15A. On the contrary, in the circuit in FIG. 17A, by providing the variable delay circuit 1701, it is possible to shift the unit delay amount on the horizontal axis to right to create a state where the unit delay amount starts from "−1", as illustrated in FIG. 17B.

When the first rising edge of the oscillation clock signal CLK2 is not positioned in the area 1101, and the second rising edge of the oscillation clock signal CLK2 is not positioned in the area 1104 under the state where the phase-locked loop circuit is locked, the offset lock detector 1503 judges that there exists an offset phase, and outputs a delay control signal corresponding to the offset phase to the variable delay circuit 1701. The variable delay circuit 1701 delays the oscillation clock signal CLK2 output by the oscillator 305 by a delay time in accordance with the delay control signal, and outputs the delayed oscillation clock signal CLK2 to the counter 306 and the time-to-digital converter 1501. Specifically, when the phase-locked loop circuit is locked in a state where no edges of the oscillation clock signal CLK2 exist in the second digital value 912 and the third digital value 913, the offset lock detector 1503 and the variable delay circuit 1701 give the offset phase to the oscillation clock signal CLK2 output by the oscillator 305. Accordingly, correction is made to create a state where the first rising edge of the oscillation clock signal CLK2 is positioned in the area 1101 and the second rising edge of the oscillation clock signal CLK2 is positioned in the area 1104, as illustrated in FIG. 17B, so that it becomes possible to perform a normal operation.

(Fourth Embodiment)

Figure 19:
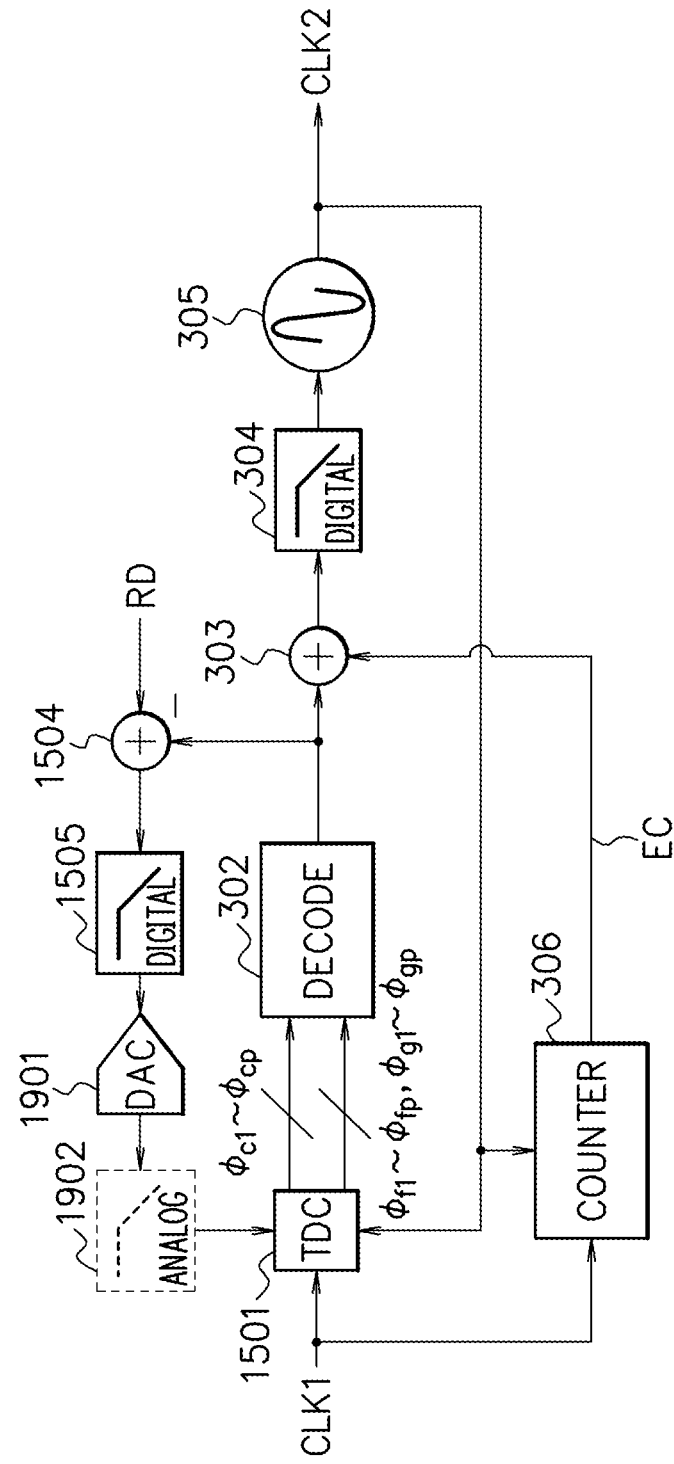
FIG. 19 is a diagram illustrating a configuration example of a polyphase clock generating circuit according to a fourth embodiment.

FIG. 19 is a diagram illustrating a configuration example of a polyphase clock generating circuit according to a fourth embodiment. The circuit in FIG. 19 corresponds to the circuit in FIG. 18 to which a digital-to-analog converter 1901 and an analog low-pass filter 1902 are added. Hereinafter, a point in which the present embodiment is different from the first embodiment will be described. The digital-to-analog converter 1901 converts a delay control signal output by the second low-pass filter 1505 from digital to analog. The low-pass filer 1902 averages the analog delay control signals through low-pass filtering, and outputs the resultant to the first delay elements 921 to 928 and the like in the first time-to-digital converter 901. The delay time of each of the first delay elements 921 to 928 is changed in accordance with the analog delay control signal. In this case, the first delay elements 921 to 928 can be controlled in an analog manner by the configuration of FIG. 10A or FIG. 10C. According to the present embodiment, the delay control of the first time-to-digital converter 901 becomes easy. Note that the low-pass filter 1902 may be eliminated. By providing the low-pass filter 1902, the delay control signal is stabilized, and a noise is reduced.

(Fifth Embodiment)

Figure 20:
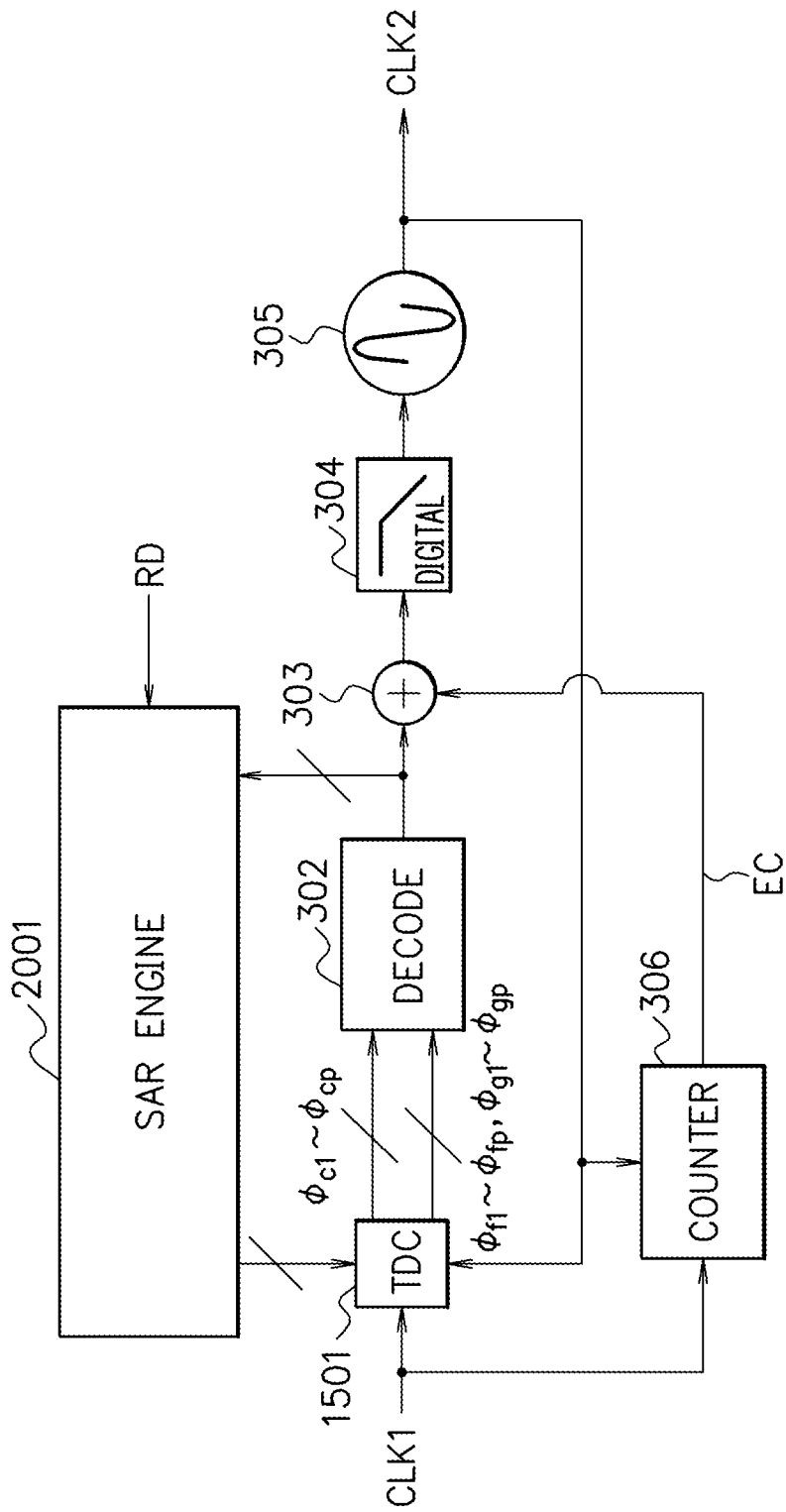
FIG. 20 is a diagram illustrating a configuration example of a polyphase clock generating circuit according to a fifth embodiment.

FIG. 20 is a diagram illustrating a configuration example of a polyphase clock generating circuit according to a fifth embodiment. The circuit in FIG. 20 corresponds to the circuit in FIG. 18 in which a successive approximation register (SAR) engine 2001 is provided in place of the subtracter 1504 and the second low-pass filter 1505. Hereinafter, a point in which the present embodiment is different from the first embodiment will be described. The successive approximation register engine 2001 is a delay control unit that performs successive approximation between the cycle of the oscillation clock signal CLK2 obtained based on at least the first digital value 911 and the third digital value 913 in FIG. 9B and the target cycle RD, in order from high-order bit, to sequentially determine the delay control signal from high-order bit, and outputs the delay control signal to the first delay elements 921 to 928 and the like in the first time-to-digital converter 901.

The successive approximation register engine 2001 obtains a difference between the cycle of the oscillation clock signal CLK2 output by the decoder 302 and the target cycle RD, in order from high-order bit, and changes the delay control signal for the first delay elements 921 to 928 and the like by 1 bit, in order from high-order bit. By comparing the state before changing the delay time of each of the first delay elements 921 to 928 and the like and the state after changing the delay time of each of the first delay elements 921 to 928 and the like, it is judged whether or not an error becomes small if the bit of the delay control signal is changed, and the same process is repeated with respect to the next bit, to thereby perform calibration by 1 bit.

Since the processing in the successive approximation register engine 2001 is simple, a circuit scale and power consumption are reduced, and a speed of convergence becomes fast. However, if the successive approximation register engine 2001 is stopped after the calibration is performed on all of bits, there is a possibility that the value of cycle of the oscillation clock signal CLK2 output by the decoder 302 is changed due to the variation in the temperature, the voltage or the like. For this reason, there is a need to detect whether the cycle of the oscillation clock signal CLK2 output by the decoder 302 is correct without stopping the successive approximation register engine 2001, even after the calibration is performed on all of bits. If the cycle is not correct, there is a need to change the value of the delay control signal to adjust the cycle of the oscillation clock signal CLK2. In this case, the variation in the cycle of the oscillation clock signal CLK2 is small, so that only a low-order bit of the delay control signal may be changed.

(Sixth Embodiment)

FIG. 21 is a diagram illustrating a configuration example of a polyphase clock generating circuit according to a sixth embodiment. The circuit in FIG. 21 corresponds to the circuit in FIG. 18 to which a divider 2201 is added. Hereinafter, a point in which the present embodiment is different from the first embodiment will be described. The oscillator 305 generates, based on the cycle of the reference clock signal CLK1 output by the first low-pass filter 304, a plurality of phases of oscillation clock signals $\phi\alpha1$ to $\phi\alpha p$ whose cycle is 1/m (m is an integer of 2 or more) of the cycle of the reference clock signal CLK1. Specifically, the oscillator 305 generates, based on the cycle of the reference clock signal CLK1 obtained based on the count number of the counter 306 and the first to third digital values 911 to 913, the plurality of phases of oscillation clock signals $\phi\alpha1$ to $\phi\alpha p$ whose cycle is 1/m (m is an integer of 2 or more) of the cycle of the reference clock signal CLK1. The divider 2201 divides a frequency of one oscillation clock signal out of the plurality of phases of oscillation clock signals $\phi\alpha1$ to $\phi\alpha p$ (the oscillation clock signal $\phi\alpha1$, for example), and outputs the resultant to the counter 306, the first time-to-digital converter 901 and the second time-to-digital converter 902. Specifically, the divider 2201 outputs a clock signal whose frequency is lower than that of the oscillation clock signals $\phi\alpha1$ to $\phi\alpha p$. Each of the first clock signals $\phi c1$ to $\phi cp$ has a frequency which is the same as that of the output clock signal of the divider 2201. As a result of this, each of the plurality of phases of first clock signals $\phi c1$ to $\phi cp$ has a frequency of 1/m which is lower than that of the plurality of phases of oscillation clock signals $\phi\alpha1$ to $\phi\alpha p$. The polyphase clock generating circuit of the present embodiment can output the plurality of phases of first clock signals $\phi c1$ to $\phi cp$ with low frequency and the plurality of phases oscillation clock signals $\phi\alpha1$ to $\phi\alpha p$ with high frequency to the outside. For example, the frequency of each of the first clock signals $\phi c1$ to $\phi cp$ is 100 MHz, and the frequency of each of the oscillation clock signals $\phi\alpha1$ to $\phi\alpha p$ is 1 GHz. According to the present embodiment, the clock signals $\phi c1$ to $\phi cp$ and the clock signals $\phi\alpha1$ to $\phi\alpha p$ of two types of frequencies can be generated.

As described above, according to the first to sixth embodiments, by using the time-to-digital converter 1501, it becomes possible to perform the digital processing at the subsequent stage of the time-to-digital converter 1501, so that the area and the power consumption are reduced in the polyphase clock generating circuit, resulting in that the noise is reduced and the performance is improved. When the accuracy of the time-to-digital converter 1501 is increased by 2 bits, the quantization noise is reduced to a quarter. Further, by using the coarse time-to-digital converter 901 and the fine time-to-digital converters 902 and 903, the number of delay elements is reduced, and the downsizing and the low power consumption can be realized, compared to a case where the one-stage time-to-digital converter 301 is used as in FIG. 3A. The polyphase clock generating circuits of the above-described embodiments can be used for radio communication circuits, processors, analog-to-digital converters, clock data recovery systems or the like.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

A first time-to-digital converter can output a plurality of phases of first clock signals. By providing first to third time-to-digital converters, it becomes possible to perform digital processing, so that it is possible to provide a high-accuracy and/or small-sized clock generating circuit.

What is claimed is:

1. A clock generating circuit, comprising:
a counter that counts a number of pulses of an oscillation clock signal existed within one cycle of a reference clock signal;
a first time-to-digital converter that generates a plurality of phases of first clock signals by relatively delaying the oscillation clock signal with respect to the reference clock signal using a plurality of first delay elements, and outputs values of the plurality of phases of first clock signals at an edge point of the reference clock signal as a first digital value;
a second time-to-digital converter that generates a plurality of phases of second clock signals by relatively delaying the oscillation clock signal with respect to the reference clock signal using a plurality of second delay elements each having a delay time shorter than a delay time of each of the first delay elements, and outputs values of the plurality of phases of second clock signals at the edge point of the reference clock signal as a second digital value;
a third time-to-digital converter that generates a plurality of phases of third clock signals by relatively delaying the first clock signal delayed by the plurality of first delay elements with respect to the reference clock signal using a plurality of third delay elements each having a delay time which is the same as the delay time of each of the second delay elements, and outputs values of the plurality of phases of third clock signals at the edge point of the reference clock signal as a third digital value;
a delay control unit that outputs a delay control signal based on a difference between a cycle of the oscillation clock signal obtained based on at least the first digital value and the third digital value and a target cycle; and
an oscillator that generates, based on a cycle of the reference clock signal obtained based on a count number of the counter and the first to third digital values, the oscillation clock signal whose cycle is 1/m (m is an integer of 2 or more) of the cycle of the reference clock signal, wherein:
the delay time of each of the plurality of first delay elements in the first time-to-digital converter is changed in accordance with the delay control signal output by the delay control unit; and
the first time-to-digital converter outputs the plurality of phases of first clock signals.

2. The clock generating circuit according to claim 1, further comprising
a first low-pass filter that is connected to an input terminal of the oscillator.

3. The clock generating circuit according to claim 1, wherein
the delay control unit has a subtracter that outputs a difference between the cycle of the oscillation clock signal obtained based on at least the first digital value and the third digital value and the target cycle.

4. The clock generating circuit according to claim 3, wherein
the delay control unit has a second low-pass filter that is connected between the subtracter and the first time-to-digital converter.

5. The clock generating circuit according to claim 1, wherein
the delay control unit has a successive approximation register engine that performs successive approximation between the cycle of the oscillation clock signal obtained based on at least the first digital value and the third digital value and the target cycle, in order from high-order bit, to sequentially determine the delay control signal from high-order bit.

6. The clock generating circuit according to claim 1, further comprising
an offset lock detector that gives, when the clock generating circuit is locked in a state where no edges of the oscillation clock signal exist in the second digital value and the third digital value, an offset phase to the cycle input into the oscillator.

7. The clock generating circuit according to claim 1, further comprising
an offset lock detector that gives, when the clock generating circuit is locked in a state where no edges of the oscillation clock signal exist in the second digital value and the third digital value, an offset phase to the oscillation clock signal output by oscillator.

8. The clock generating circuit according to claim 1, further comprising
a digital-to-analog converter that converts the delay control signal output by the delay control unit from digital to analog, wherein
the delay time of each of the plurality of first delay elements in the first time-to-digital converter is changed in accordance with the analog delay control signal.

9. The clock generating circuit according to claim 1, wherein:
the oscillator generates a plurality of phases of oscillation clock signals; and
the clock generating circuit further comprises a divider that divides a frequency of one oscillation clock signal out of the plurality of phases of oscillation clock signals, and outputs the resultant to the counter, the first time-to-digital converter and the second time-to-digital converter.

* * * * *